US012708027B2

(12) United States Patent
Lee et al.

(10) Patent No.: US 12,708,027 B2
(45) Date of Patent: Aug. 11, 2026

(54) MULTILAYER ENCAPSULATION FOR HUMIDITY ROBUSTNESS AND HIGHLY ACCELERATED STRESS TESTS AND RELATED FABRICATION METHODS

(71) Applicant: Wolfspeed, Inc., Durham, NC (US)

(72) Inventors: Kyoung-Keun Lee, Cary, NC (US); Daniel Etter, Durham, NC (US); Fabian Radulescu, Chapel Hill, NC (US); Scott Sheppard, Chapel Hill, NC (US); Daniel Namishia, Wake Forest, NC (US)

(73) Assignee: WOLFSPEED, INC., Durham, NC (US)

( * ) Notice: Subject to any disclaimer, the term of this patent is extended or adjusted under 35 U.S.C. 154(b) by 644 days.

(21) Appl. No.: 17/591,704

(22) Filed: Feb. 3, 2022

(65) Prior Publication Data

US 2022/0384290 A1 Dec. 1, 2022

Related U.S. Application Data

(63) Continuation-in-part of application No. 17/335,796, filed on Jun. 1, 2021.

(51) Int. Cl.
*H01L 29/15* (2006.01)
*H01L 31/0256* (2006.01)
(Continued)

(52) U.S. Cl.
CPC ........ *H10W 74/121* (2026.01); *H10D 30/792* (2025.01); *H10P 14/6339* (2026.01); (Continued)

(58) Field of Classification Search
CPC ......... H01L 2924/0002; H01L 51/5237; H01L 21/045; H01L 21/3145; H01L 21/318; (Continued)

(56) References Cited

U.S. PATENT DOCUMENTS 4,593,302 A 6/1986 Lidow et al.
5,214,636 A 5/1993 Ishikawa et al.
(Continued)

FOREIGN PATENT DOCUMENTS

CN 1807357 A 7/2006
CN 101024324 A 8/2007
(Continued)

OTHER PUBLICATIONS

Notification of Transmittal of the International Search Report and the Written Opinion of the International Searching Authority, or the Declaration, in corresponding PCT Application No. PCT/US2022/030619 (Nov. 8, 2022).

*Primary Examiner* — Leonard Chang
*Assistant Examiner* — Tsz K Chiu
(74) *Attorney, Agent, or Firm* — Myers Bigel, P.A.

(57) ABSTRACT

A semiconductor die includes a semiconductor body, and a multi-layer environmental barrier on the semiconductor body. The multi-layer environmental barrier includes a plurality of sublayers that are stacked on the semiconductor body. Each of the sublayers comprises a respective stress in one or more directions, where the respective stresses of at least two of the sublayers are different. The sublayers may include a first stressor sublayer comprising first stress, and a second stressor sublayer comprising a second stress that at least partially compensates for the first stress in the one or more directions. Related devices and methods of fabrication are also discussed.

43 Claims, 14 Drawing Sheets

(51) Int. Cl.

| | |
|---|---|
| ***H10D 30/69*** | (2025.01) |
| ***H10P 14/60*** | (2026.01) |
| ***H10W 42/00*** | (2026.01) |
| ***H10W 74/01*** | (2026.01) |
| ***H10W 74/10*** | (2026.01) |

(52) U.S. Cl.
CPC ........... *H10P 14/662* (2026.01); *H10W 42/00* (2026.01); *H10W 74/01* (2026.01)

(58) Field of Classification Search
CPC ............. H01L 21/3185; H01L 2924/00; H01L 29/1608; H01L 29/2003; H01L 29/24; H01L 2924/12044; H01L 51/448; H01L 51/5256; H01L 2924/09701; H01L 21/4867; H01L 21/6835; H01L 2221/68359; H01L 2224/05624; H01L 23/4985; H01L 25/0655; H01L 25/50; H01L 27/14601; H01L 2924/01019; H01L 2924/01046; H01L 2924/01057; H01L 2924/01079; H01L 2924/13091; H01L 2924/3025; H01L 29/405; H01L 29/6606; H01L 29/732; H01L 29/74; H01L 29/78; H01L 29/868; H01L 29/872; H01L 31/03921; H01L 31/1055; H01L 21/7682; H01L 23/3192; H01L 23/5222; H01L 23/53223; H01L 23/53228; H01L 23/53238; H01L 23/5329; H01L 23/562; H01L 27/16; H01L 28/20; H01L 31/02167; H01L 31/0749; H01L 51/0096; H01L 51/0097; H01L 2251/566; H01L 23/564; H01L 27/1425; H01L 29/66462; H01L 29/7787; H01L 31/022425; H01L 31/0296; H01L 31/0322; H01L 31/0368; H01L 31/048; H01L 31/075; H01L 51/003; H01L 51/5203; H01L 51/5206; H01L 51/5253; H01L 51/56; H10W 74/121; H10W 42/00; H10W 74/01; H10W 20/484; H10W 44/20; H10W 74/114; H10W 74/137; H10W 74/147; H10W 76/15; H10W 74/43; H10D 30/792; H10D 30/475; H10D 30/60; H10D 30/87; H10D 64/111; H10D 62/8503; H10D 64/518; H10P 14/6339; H10P 14/662
See application file for complete search history.

(56) References Cited

U.S. PATENT DOCUMENTS

| | | | | |
|---|---|---|---|---|
| 5,686,360 | A | 11/1997 | Harvey et al. | |
| 6,169,308 | B1 | 1/2001 | Sunami et al. | |
| 6,246,076 | B1 | 6/2001 | Lipkin et al. | |
| 6,607,852 | B2 * | 8/2003 | Spitsberg | C04B 41/009 416/241 B |
| 7,483,462 | B2 | 1/2009 | Johnson | |
| 7,525,122 | B2 | 4/2009 | Ring et al. | |
| 9,812,338 | B2 | 11/2017 | Ring et al. | |
| 10,707,858 | B2 | 7/2020 | Das et al. | |
| 2002/0109168 | A1 | 8/2002 | Kim et al. | |
| 2003/0044552 | A1 | 3/2003 | Komada | |
| 2003/0085652 | A1 * | 5/2003 | Weaver | H10K 59/878 313/506 |
| 2003/0089928 | A1 | 5/2003 | Saito et al. | |
| 2003/0117066 | A1 | 6/2003 | Silvernail | |
| 2003/0117068 | A1 * | 6/2003 | Forrest | H10K 59/8731 313/504 |
| 2003/0209708 | A1 | 11/2003 | Kubota | |
| 2004/0202097 | A1 | 10/2004 | Oyake et al. | |
| 2005/0023974 | A1 | 2/2005 | Chwang et al. | |
| 2005/0233484 | A1 | 10/2005 | Stein et al. | |
| 2007/0001174 | A1 | 1/2007 | Ring et al. | |
| 2007/0184286 | A1 | 8/2007 | Nakayama et al. | |
| 2008/0035934 | A1 | 2/2008 | Sheppard et al. | |
| 2008/0157291 | A1 | 7/2008 | Li et al. | |
| 2008/0174457 | A1 | 7/2008 | Minakawa et al. | |
| 2009/0291293 | A1 | 11/2009 | Sakakura | |
| 2009/0297703 | A1 | 12/2009 | Li et al. | |
| 2010/0176383 | A1 | 7/2010 | Park et al. | |
| 2010/0193772 | A1 | 8/2010 | Fujimori et al. | |
| 2010/0279092 | A1 * | 11/2010 | Hwang | B32B 15/04 977/700 |
| 2012/0219808 | A1 | 8/2012 | Raybould et al. | |
| 2012/0281452 | A1 | 11/2012 | Huo et al. | |
| 2013/0147022 | A1 | 6/2013 | Yoon et al. | |
| 2013/0320564 | A1 | 12/2013 | Brain et al. | |
| 2013/0344319 | A1 | 12/2013 | Zhu et al. | |
| 2014/0097469 | A1 | 4/2014 | Hagleitner et al. | |
| 2014/0103363 | A1 * | 4/2014 | Ring | H01L 23/53252 257/77 |
| 2014/0264297 | A1 | 9/2014 | Kumar et al. | |
| 2014/0264960 | A1 | 9/2014 | Ring et al. | |
| 2015/0187855 | A1 | 7/2015 | Yamazaki et al. | |
| 2015/0221891 | A1 * | 8/2015 | Ghosh | H10K 59/8731 204/192.15 |
| 2015/0271911 | A1 * | 9/2015 | Chen | H05K 1/0216 29/841 |
| 2015/0333083 | A1 * | 11/2015 | Lai | H10B 43/27 438/588 |
| 2016/0093748 | A1 | 3/2016 | Mieczkowski et al. | |
| 2017/0294532 | A1 | 10/2017 | Kudymov et al. | |
| 2018/0217299 | A1 | 8/2018 | Takahashi | |
| 2019/0309413 | A1 * | 10/2019 | Wu | C23C 16/405 |
| 2019/0385954 | A1 | 12/2019 | Rondon et al. | |
| 2021/0257448 | A1 * | 8/2021 | Sampayan | H01L 29/0611 |
| 2022/0384366 | A1 * | 12/2022 | Lee | H01L 23/564 |

FOREIGN PATENT DOCUMENTS

| | | | | |
|---|---|---|---|---|
| JP | 2016506315 | A | 3/2016 | |
| JP | 6211168 | B2 | 9/2017 | |
| WO | 2012039310 | A1 | 3/2012 | |
| WO | WO-2022256196 | A1 * | 12/2022 | H01L 21/022 |

* cited by examiner

MULTILAYER ENCAPSULATION FOR HUMIDITY ROBUSTNESS AND HIGHLY ACCELERATED STRESS TESTS AND RELATED FABRICATION METHODS

CLAIM OF PRIORITY

The present application is a continuation-in-part of and claims priority from U.S. patent application Ser. No. 17/335,796, filed Jun. 1, 2021, the disclosure of which is incorporated by reference herein in its entirety.

FIELD

The present invention relates to semiconductor devices, and more particularly, to environmental protection of semiconductor devices and related fabrication methods.

BACKGROUND

Materials such as silicon (Si) and gallium arsenide (GaAs) have found wide application in semiconductor devices for low power and, in the case of Si, low frequency applications. However, these materials may not be well-suited for high power and/or high frequency applications, for example, due to their relatively small bandgaps (1.12 eV for Si and 1.42 for GaAs at room temperature) and relatively small breakdown voltages.

For high power, high temperature and/or high frequency applications and devices, wide bandgap semiconductor materials may be used, such as silicon carbide (SiC) (e.g., with a bandgap of about 3.2 eV for 4H—SiC at room temperature) and the Group III nitrides (e.g., with a bandgap of about 3.36 eV for gallium nitride (GaN) at room temperature). As used herein, the term “Group III nitride” refers to those semiconducting compounds formed between nitrogen (N) and the elements in Group III of the periodic table, usually aluminum (Al), gallium (Ga), and/or indium (In). The term refers to binary, ternary, and quaternary compounds, such as GaN, AlGaN, and AlInGaN. These compounds have empirical formulas in which one mole of nitrogen is combined with a total of one mole of the Group III elements. These materials may have higher electric field breakdown strengths and higher electron saturation velocities as compared to GaAs and Si.

Semiconductor devices fabricated from SiC and/or Group III nitrides may include power transistor devices, such as field effect transistor (FET) devices including MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc. These devices are typically passivated with an oxide layer, such as silicon dioxide ($SiO_2$), to protect the exposed surfaces of the device and/or other reasons. The interface between the semiconductor body and the oxide layer, however, may be insufficient to obtain a high surface mobility of electrons. For example, the interface between SiC and $SiO_2$ conventionally exhibits a high density of interface states, which may reduce surface electron mobility and introduce carrier traps, which in turn can reduce the desired performance characteristics of devices. Accordingly, semiconductor devices, including those that include oxide layers, may also incorporate one or more layers of silicon nitride (e.g., amorphous silicon nitride, SiNx) to improve the resulting electronic properties, e.g., as described in U.S. Pat. No. 6,246,076.

Semiconductor devices may be required to operate in high temperature and/or high humidity environments, and insufficiently designed or processed chips can exhibit failure mechanisms that may reduce or compromise the expected device operating life. For example, if moisture is allowed to reach the semiconductor devices, corrosion may occur, which may degrade performance of the semiconductor devices. Humidity protection on the semiconductor components is typically implemented using a final passivation film, such as SiN, with a single layer deposited by CVD.

As an environmental barrier, SiN may form a better seal over the device in comparison to $SiO_2$, reducing or preventing contaminants such as water from reaching the epitaxial layers of the device and causing degradation. Plasma Enhanced Chemical Vapor Deposition (PECVD) may be used to form SiN as an environmental barrier for a semiconductor device, e.g., as described in U.S. Pat. No. 7,525,122. However, a PECVD SiN layer may be prone to defects, such as pin holes and columnar structures, which can allow moisture to penetrate the SiN layer and reach the device.

SUMMARY

According to some embodiments of the present invention, a semiconductor die includes a semiconductor body, and a multi-layer environmental barrier on the semiconductor body. The multi-layer environmental barrier includes first and second sublayers of first and second oxide materials, respectively, where the first oxide material is different than the second oxide material.

In some embodiments, the first and second sublayers may be Atomic Layer Deposition (ALD) layers.

In some embodiments, at least one of the first or second oxide material may have a density that is greater than silicon nitride.

In some embodiments, at least one of the first or second oxide material may be an insulating metal oxide.

In some embodiments, the first and second sublayers may be included in a repeating layer structure, and wherein the first and second oxide materials comprise the insulating metal oxide and a non-metal oxide, respectively.

In some embodiments, the insulating metal oxide may be at least one of aluminum oxide, zirconium oxide, or hafnium oxide.

In some embodiments, the insulating metal oxide may be aluminum oxide, and wherein the non-metal oxide comprises silicon oxide.

In some embodiments, a ratio of a thickness of the first sublayer to a thickness of the second sublayer may be about 2:1 or more, about 5:1 or more, or about 8:1 or more.

In some embodiments, a passivation layer may be provided between the semiconductor body and the multi-layer environmental barrier. For example, the passivation layer may include silicon nitride.

In some embodiments, a surface of the multi-layer environmental barrier opposite the passivation layer may include a layer of silicon oxide or silicon nitride.

In some embodiments, the first oxide material may have a different diffusion coefficient with respect to water than the second oxide material.

In some embodiments, a gate, a source contact, and a drain contact may be provided on the semiconductor body, and a passivation layer may extend on the gate, the source contact, and the drain contact. The first and second sublayers may conformally extend on the passivation layer with respective thicknesses that are substantially uniform along the gate, the source contact, and the drain contact.

In some embodiments, the first and second sublayers may be included in a repeating layer structure. The multi-layer environmental barrier may include at least two of the repeating layer structure, at least ten of the repeating layer structure, or at least twenty of the repeating layer structure.

In some embodiments, a total thickness of the multi-layer environmental barrier may be about 500 Angstroms to about 3000 Angstroms.

In some embodiments, the repeating layer structure may be a binary structure in which the first and second sublayers are stacked; a ternary structure in which the first sublayer, the second sublayer, and a third sublayer are stacked; and/or a quaternary structure in which the first sublayer, the second sublayer, a third sublayer, and a fourth sublayer are stacked.

According to some embodiments of the present invention, a semiconductor die includes a semiconductor body, and a multi-layer environmental barrier on the semiconductor body. The multi-layer environmental barrier includes a repeating layer structure having two or more sublayers of respective insulating materials, where at least one of the respective insulating materials has a density that is greater than silicon nitride.

In some embodiments, the two or more sublayers may be Atomic Layer Deposition (ALD) layers.

In some embodiments, the density of the at least one of the respective insulating materials may be greater than a density of at least one other of the respective insulating materials.

In some embodiments, the at least one of the respective insulating materials may be a metal oxide, and at least one other of the respective insulating materials may be a non-metal oxide.

In some embodiments, the metal oxide may be aluminum oxide, zirconium oxide, or hafnium oxide.

In some embodiments, the non-metal oxide may be silicon oxide.

In some embodiments, a passivation layer may be provided between the semiconductor body and the multi-layer environmental barrier.

In some embodiments, a ratio of respective thicknesses of first and second sublayers of the two or more sublayers may be about 2:1 or more, about 5:1 or more, or about 8:1 or more.

In some embodiments, a gate, a source contact, and a drain contact may be provided on the semiconductor body, and a passivation layer may extend on the gate, the source contact, and the drain contact. The two or more sublayers may conformally extend on the passivation layer with respective thicknesses that are substantially uniform along the gate, the source contact, and the drain contact.

In some embodiments, at least two of the respective insulating materials may have different diffusion coefficients with respect to water.

According to some embodiments of the present invention, a semiconductor die includes a semiconductor body, and a multi-layer environmental barrier on the semiconductor body. The multi-layer environmental barrier includes a repeating layer structure having a first insulating sublayer and a second insulating sublayer. A ratio of a first thickness of the first insulating sublayer to a second thickness of the second insulating sublayer is about 2:1 or more.

In some embodiments, the first and second insulating sublayers may be first and second materials, respectively, and a density of the first material may be greater than a density of the second material.

In some embodiments, the density of at least one of the first material or the second material may be greater than silicon nitride.

In some embodiments, the first and second insulating sublayers may be Atomic Layer Deposition (ALD) layers.

In some embodiments, the first material may be a metal, and the second material may be a non-metal.

In some embodiments, the first material may be aluminum oxide, zirconium oxide, hafnium oxide, or silicon nitride.

In some embodiments, the second material may be silicon oxide.

In some embodiments, the first material may have a different diffusion coefficient with respect to water than the second material.

According to some embodiments of the present invention, a method of fabricating a semiconductor die includes providing a semiconductor body, and forming a multi-layer environmental barrier on the semiconductor body. The multi-layer environmental barrier includes first and second sublayers of first and second oxide materials, respectively, where the first oxide material is different than the second oxide material.

In some embodiments, forming the multi-layer environmental barrier on the passivation layer may include forming the first and second sublayers by Atomic Layer Deposition (ALD).

In some embodiments, forming the multi-layer environmental barrier may include alternatingly performing a first ALD process to form the first sublayer and a second ALD process to form the second sublayer on the first sublayer to define a repeating layer structure.

In some embodiments, at least one of the first or second oxide material may have a density that is greater than silicon nitride.

In some embodiments, at least one of the first or second oxide material may be an insulating metal oxide.

In some embodiments, another of the first and second oxide materials may be a non-metal oxide.

In some embodiments, the insulating metal oxide may be at least one of aluminum oxide, zirconium oxide, or hafnium oxide.

In some embodiments, the insulating metal oxide may be aluminum oxide, and the non-metal oxide may be silicon oxide.

In some embodiments, a passivation layer may be formed on the semiconductor body prior to forming the multi-layer environmental barrier.

In some embodiments, a gate, a source contact, and a drain contact may be formed on the semiconductor body. A passivation layer may be formed on the gate, the source contact, and the drain contact. The first and second sublayers may conformally extend on the passivation layer with respective thicknesses that are substantially uniform along the gate, the source contact, and the drain contact.

In some embodiments, a surface of the multi-layer environmental barrier opposite the semiconductor body may include a layer of silicon oxide or silicon nitride.

In some embodiments, the first oxide material may have a different diffusion coefficient with respect to water than the second oxide material.

According to some embodiments of the present invention, a semiconductor die includes a semiconductor body, and a multi-layer environmental barrier comprising a plurality of sublayers that are stacked on the semiconductor body. Each of the sublayers comprises a respective stress in one or more directions, and the respective stresses of at least two of the sublayers are different.

In some embodiments, the at least two of the sublayers may include a first stressor sublayer comprising first stress, and a second stressor sublayer comprising a second stress that at least partially compensates for the first stress in the one or more directions.

In some embodiments, the first stress may be tensile, and the second stress may be compressive.

In some embodiments, the first and second stressor sublayers may include first and second oxide materials, respectively. The first oxide material may be different than the second oxide material.

In some embodiments, at least one of the first or second stressor sublayers may include an metal insulating material.

In some embodiments, another of the first or second stressor sublayers may include a metal.

In some embodiments, the metal insulating material may include at least one of aluminum oxide, zirconium oxide, or hafnium oxide.

In some embodiments, another of the first or second stressor sublayers may include a non-metal insulating material.

In some embodiments, the metal insulating material may include aluminum oxide, and the non-metal insulating material may include silicon oxide.

In some embodiments, the sublayers comprise a repeating layer structure that includes the first and second stressor sublayers.

In some embodiments, the repeating layer structure may include a binary structure in which the first and second stressor sublayers are stacked; a ternary structure in which the first stressor sublayer, the second stressor sublayer, and a third stressor sublayer are stacked; and/or a quaternary structure in which the first stressor sublayer, the second stressor sublayer, the third stressor sublayer, and a fourth stressor sublayer are stacked.

In some embodiments, the multi-layer environmental barrier may include at least two of the repeating layer structure, at least ten of the repeating layer structure, or at least twenty of the repeating layer structure.

In some embodiments, the first stressor sublayer may be between the second stressor sublayer and the semiconductor body. The first stressor sublayer may include a first material having a greater density than a second material of the second stressor sublayer.

In some embodiments, a density of at least one of a first material of the first stressor sublayer or a second material of the second stressor sublayer may be greater than silicon nitride.

In some embodiments, a ratio of a thickness of the first stressor sublayer to a thickness of the second stressor sublayer may be about 2:1 or more, about 5:1 or more, or about 8:1 or more.

In some embodiments, the semiconductor die may further include a gate, a source contact, and a drain contact on the semiconductor body. The first and second stressor sublayers may conformally extend directly on the gate, the source contact, and the drain contact with respective thicknesses that are substantially uniform.

In some embodiments, the first and second stressor sublayers may include Atomic Layer Deposition (ALD) layers.

In some embodiments, the multi-layer environmental barrier may include one or more diffusion barrier properties, and a collective stress of the sublayers of the multi-layer environmental barrier may be less than that of one or more silicon nitride layers comprising at least one of the diffusion barrier properties.

According to some embodiments of the present invention, a semiconductor die includes a semiconductor body, and a multi-layer environmental barrier comprising two or more sublayers that are stacked on the semiconductor body in a repeating layer structure. The multi-layer environmental barrier comprises two or more diffusion barrier properties. A collective stress of the multi-layer environmental barrier is less than that of one or more silicon nitride layers comprising at least one of the diffusion barrier properties.

In some embodiments, each of the sublayers may include a respective stress in one or more directions, and the respective stresses of at least two of the sublayers may be different.

In some embodiments, the at least one of the diffusion barrier properties may include humidity protection, and a total thickness of the multi-layer environmental barrier may be about 500 Angstroms to about 3500 Angstroms.

In some embodiments, the collective stress of the multi-layer environmental barrier may be less than that of the one or more silicon nitride layers over an operating temperature range of a packaged device including the semiconductor die.

According to some embodiments of the present invention, a method of fabricating a semiconductor die includes providing a semiconductor body, and forming a multi-layer environmental barrier comprising a plurality of sublayers that are stacked on the semiconductor body. Forming the multi-layer environmental barrier includes forming a first stressor sublayer comprising a first stress, and forming a second stressor sublayer comprising a second stress on the first stressor sublayer, where the second stress at least partially compensates for the first stress in one or more directions.

In some embodiments, the first stress may be tensile, and the second stress may be compressive.

In some embodiments, forming the multi-layer environmental barrier may include forming the first and second stressor sublayers using Atomic Layer Deposition (ALD).

In some embodiments, forming the multi-layer environmental barrier may include alternatingly performing a first ALD process to form the first stressor sublayer and a second ALD process to form the second stressor sublayer in a repeating layer structure.

In some embodiments, the first and second stressor sublayers may include first and second oxide materials, respectively, where the first oxide material is different than the second oxide material.

In some embodiments, at least one of the first or second stressor sublayers may include an metal insulating material. The metal insulating material may include at least one of aluminum oxide, zirconium oxide, or hafnium oxide.

In some embodiments, another of the first or second stressor sublayers may include a metal.

In some embodiments, another of the first or second stressor sublayers may include a non-metal insulating material.

In some embodiments, the metal insulating material may include aluminum oxide, and the non-metal insulating material may include silicon oxide.

In some embodiments, the first stressor sublayer may include a first material having a greater density than a second material of the second stressor sublayer.

In some embodiments, the multi-layer environmental barrier may include one or more diffusion barrier properties, and a collective stress of the sublayers of the multi-layer environmental barrier may be less than that of one or more silicon nitride layers comprising at least one of the diffusion barrier properties.

In some embodiments, a total thickness of the multi-layer environmental barrier may be about 500 Angstroms to about 3500 Angstroms.

According to some embodiments of the present invention, a semiconductor die, includes a semiconductor body and a multi-layer environmental barrier on the semiconductor body. The multi-layer environmental barrier includes a first sublayer of a metal insulating material and a second sublayer of an non-metal insulating material that are stacked on one another.

In some embodiments, the metal insulating material may be a metal oxide or metal nitride, and the non-metal insulating material may be a non-metal oxide or a non-metal nitride.

In some embodiments, the metal insulating material may include at least one of aluminum (Al), zirconium (Zr), or hafnium (Hf), and the non-metal insulating material may include at least one of bismuth (B), silicon (Si), germanium (Ge), arsenic (As), antimony (Sb), or tellurium (Te).

In some embodiments, the first sublayer may be between the second sublayer and the semiconductor body.

In some embodiments, the first sublayer may include a first stress, and the second sublayer may include a second stress that at least partially compensates for the first stress in one or more directions.

In some embodiments, the first and second sublayers may be alternately stacked in a repeating layer structure. For example, the multi-layer environmental barrier comprises at least two of the repeating layer structure, at least ten of the repeating layer structure, or at least twenty of the repeating layer structure In some embodiments, the semiconductor die may include a High Electron Mobility Transistor.

In some embodiments, the semiconductor die may include a Metal Oxide Semiconductor Field Effect Transistor.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 6A is a cross-sectional view of a HEMT device; FIG. 6B is an enlarged view of the passivation layer and multi-layer environmental barrier shown in FIG. 6A; and FIG. 6C is an enlarged view of the multi-layer environmental barrier shown in FIG. 6B.

DETAILED DESCRIPTION OF EMBODIMENTS

Figure 1:
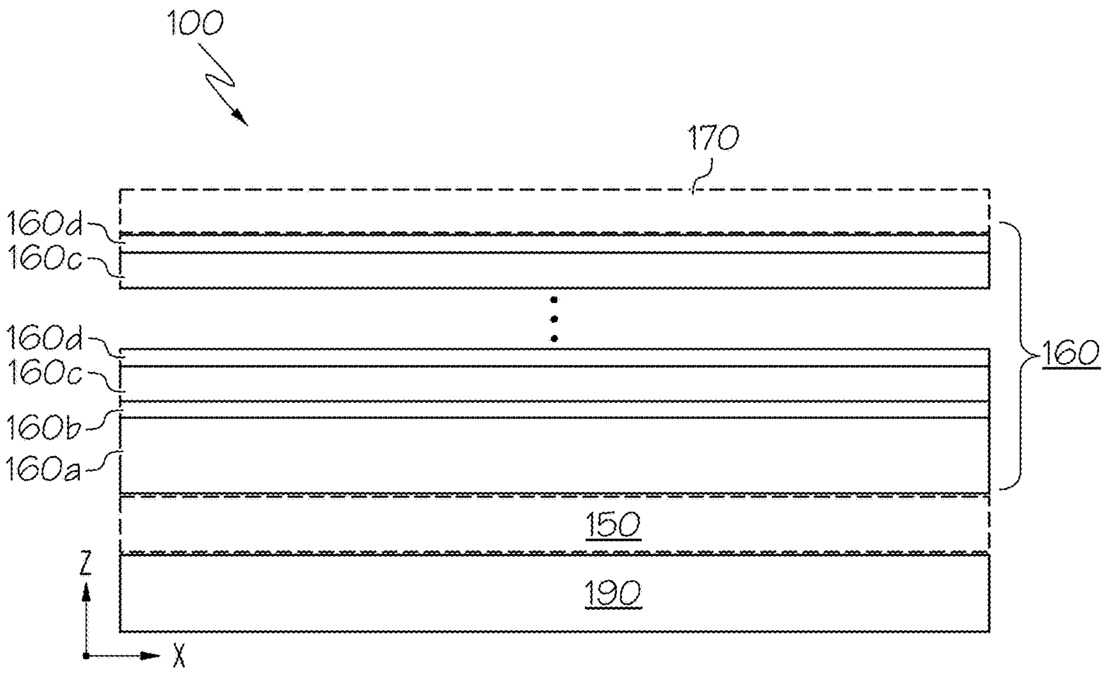
FIG. 1 is a schematic cross-sectional view of a semiconductor device including a multi-layer environmental barrier according to some embodiments of the present invention.

Packages for some semiconductor devices may not provide a hermetic seal for environmental protection in some applications. The environment may include an operating environment (i.e., when operating under bias in user application) or a fabrication environment (i.e., under processing conditions that may include different ionic contaminant profiles, such as integration, package technologies, etc.). An encapsulation structure or environmental barrier may thus be provided on semiconductor devices (also referred to as a die-level environmental barrier) as protection from humidity and/or other conditions of the environment. As used herein, a "die" or chip may refer to a small block or body of semiconducting material or other substrate on which electronic circuit elements are fabricated. A die may include a large number of individual "unit cell" transistor structures, which in some implementations may be connected electrically in parallel or in series. A semiconductor die as described herein may include the semiconductor body as well as the metal and/or insulating layers that are formed thereon.

One implementation of a die-level environmental barrier may be a topmost or final passivation film, which is typically a single layer deposited by chemical vapor deposition (CVD). The material selection for the final passivation film may be dictated by the desired diffusion barrier properties, with the function being to prevent various contaminant species present in the humid environment from reaching the active area of the semiconductor die. For example, in addition to water vapor, a high humidity environment may also include trace elements of various atomic, molecular and ionic contaminant species. Examples of various ionic species may include, but are not limited to, halogens (e.g., Cl—, F—, Br—, etc.), molecular ions (e.g., OH—, $NO_2$—, $NO_3$—, $PO_4$—, $SO_4$—, etc.), cations (e.g., Na+, K+, Au+, Ti+, etc.), and weak organic acids (e.g., carbonates, acetates, etc.). Such ionic species may be a source of degradation for an electrical device under bias, as the electric field can accelerate the ionic movement or diffusion through the humidity protection layers. For example, a PECVD SiN layer may provide diffusion barrier properties with respect to water molecules, but be susceptible to oxidation, etching, and/or corrosion in the presence of contaminant halogens (e.g., F— and Cl—), in addition to being susceptible to moisture ingress due to defects (such as pin holes and/or columnar structures) therein. The presence of such contaminants may be a common occurrence and may be provided from multiple sources.

Some embodiments of the present invention may arise from realization that, given the wide variety of possible contaminant species, the choice of the protective film material may represent a non-ideal trade-off. Embodiments of the present invention thus provide a protective film including multiple stacked sublayers of various insulating materials (such as dielectric materials) having different characteristics, also referred to herein as a multi-layer environmental barrier film or stack or structure, or simply multi-layer environmental barrier. The multi-layer environmental barrier may include respective insulating sublayers having different diffusion barrier properties, so as to protect the semiconductor die against not only water molecules, but also against various ionic species that may be present in the environment. That is, stacking sublayers of various insulating materials with different diffusion coefficients (e.g., with respect to water molecules) can provide a humidity barrier that targets the movement of various ionic trace elements, in addition to water molecules in the environment. It will be understood that layers or sublayers described herein may be uniform or varying in thickness, and/or may be continuous or discontinuous.

As discussed herein, the multi-layer environmental barrier is a low-defect, highly conformal material stack. In particular, the multi-layer environmental barrier may include two or more sublayers of various materials and/or thicknesses (e.g., as an alternating or repeating layer structure in some embodiments) in order to target different contaminant species and provide a more robust humidity diffusion barrier for a semiconductor device. Some embodiments described herein may provide a multi-layer environmental barrier that replaces SiN or includes additional sublayers of different insulating materials in combination with (e.g., alternating with) SiN sublayers, which may reduce defect formation and/or slow down the effects of halogens, thereby improving the diffusion barrier properties of the stack. In some embodiments, at least one of the sublayers may include a material having a density that is greater than SiN, which may impede humidity and/or other contaminant ingress. More generally, the selection of different characteristics for the sublayers and/or additional interfaces defined between the sublayers as described herein may provide increased barriers to propagation of defects or contaminants.

FIG. 1 is a schematic cross-sectional view of a semiconductor device or die 100 including a multi-layer environmental barrier according to some embodiments of the present invention. As shown in FIG. 1, a multi-layer environmental barrier film or stack 160 is provided on a semiconductor body 190 to protect the semiconductor body 190 from humidity and/or other conditions of the environment. The semiconductor body 190 may be provided on a substrate (shown in subsequent figures as 122), such as a silicon carbide (SiC) substrate. The semiconductor body 190 may be a SiC— and/or Group III nitride-based material in some embodiments. A portion of the semiconductor body 190 may define a channel region of a transistor device. Metal layers and/or other structures of such transistor devices are not shown in FIG. 1.

In some embodiments, an optional (indicated by dashed lines) passivation layer or layer structure 150 may be provided on a surface of a semiconductor body 190, and the multi-layer environmental barrier 160 may be provided on the passivation layer(s) opposite the semiconductor body 190. The passivation structure 150 may be configured to reduce parasitic capacitance, reduce charge trapping, and/or otherwise improve electronic properties of one or more layers of the semiconductor body 190. When present, the passivation structure 150 may include one or more layers of SiN, for example, as deposited by CVD. More generally, the passivation structure 150 may be a multi-layered deposition using a deposition method other than atomic layer deposition (ALD).

The multi-layer environmental barrier 160 includes two or more sublayers **160*a*-60*d* of respective insulating materials having different characteristics formed in a stacked structure. In some embodiments, the sublayers 160*a*-60*d* may be alternatingly stacked in a periodic or other repeating layer structure. For example, the multi-layer stack 160 may include a binary stack (including two sublayers 160*a*, 160*b* in each period, e.g., AlOx-SiOx), a ternary stack (including three sublayers 160*a*, 160*b*, 160*c* in each period, e.g., AlOx-SiOx-HfOx), or a quaternary stack (including four sublayers 160*a*, 160*b*, 160*c*, 160*d* in each period, e.g., AlOx-SiOx-HfOx-ZrOx). More generally, multi-layer environmental barriers 160 as described herein are not limited as to the number of sublayers 160*a*-60*d* in each repeating structure or period. Likewise, multi-layer environmental barriers 160 as described herein are not limited as to the number of repeating structures or periods in the stack. The multi-layer stack 160 may also include combinations of different repeating layer structures, e.g., a repeating structure of a quaternary stack on binary stack, in some instances with one or more intervening layers. The repeating layer structures may be periodic or non-periodic. In some embodiments, the multi-layer environmental barrier 160 may include at least two repeating layer structures or periods, at least ten repeating layer structures or periods, or at least 20 repeating layer structures or periods. Each repeating layer structure may have a thickness of about more than about 5 nanometers (nm) (about 50 Angstroms (Å)), for example, about 10 nm (100 Å). The multi-layer environmental barrier 160** may thus have a total thickness of about 500 Å to about 8000 Å, for example, more than about 1000 Å, more than about 1500 Å, or about 2000 Å or more.

The different characteristics of two or more of the sublayers **160*a*-60*d* within each periodic or repeating layer structure may provide respective diffusion barrier properties. The respective diffusion barrier properties may be defined by the material composition and/or thickness of each sublayer 160*a*-160*d***. For example, insulating sublayers of comparatively denser materials (e.g., having a density greater than silicon nitride, such as aluminum oxides or other insulating metal oxides or nitrides) and/or comparatively greater thicknesses may provide better protection against ingress of water/humidity and/or various ionic species that may be present in the environment. Insulating sublayers of other materials (e.g., semiconductor oxides or nitrides, such as silicon oxides) may provide better protection against etchants and/or other subsequent fabrication conditions. As used herein, a "non-metal" insulating material or layer may refer to insulating materials or layers that are free of metals, but may include metalloids or semi-metals, such as (but not limited to) bismuth (B), silicon (Si), germanium (Ge), arsenic (As), antimony (Sb), tellurium (Te). Examples of non-metal insulating materials or layers may include, but are not limited to, metalloid oxides (e.g., BOx, SiOx, GeOx, AsOx, SbOx, TeOx) and metalloid nitrides (e.g., SiN).

A topmost sublayer **160*d* of the stack 160 (or an additional capping layer 170 on the topmost sublayer 160*d***) may be a non-metal insulating material or layer (e.g., a semi-metal insulating material such as silicon oxide or silicon nitride)

that protects underlying layers from subsequent chemical processing conditions (e.g., basic etch chemistries). In addition, respective interfaces between a multi-layer stack of the sublayers 160_a_-160_d_ having different characteristics can provide barriers that prevent defects and/or contaminants of one sublayer from propagating to the next sublayer in the stack 160. Accordingly, stacking multiple sublayers 160_a_-160_d_ of various materials and/or thicknesses (e.g., in a repeating layer structure) that are each configured based on a respective contaminant or environmental condition may provide protection against multiple contaminant species.

That is, a multi-layer environmental barrier 160 including a combination of sublayers 160_a_-160_d_ with different diffusion barrier properties can be tailored to protect against ingress of a wider range of contaminant species than any one sublayer. Such contaminant species may include, but are not limited to, halogens (Cl—, F—, Br—), molecular ions (OH—, NO2-, NO3-, PO4-, SO4-, etc.), cations (Na+, K+, Au+, Ti+, etc.), and weak organic acids (carbonates, acetates, etc.) For instance, the sublayer 160_a_ may include a material composition and/or thickness that provides a low diffusion coefficient with respect to water, the sublayer 160_b_ may include a material composition and/or thickness that provides a low diffusion coefficient with respect to halogen-based ionic species, the sublayer 160_c_ may include a material composition and/or thickness that provides a low diffusion coefficient with respect to non-halogen-based ionic species, and the sublayer 160_d_ may include a material composition and/or thickness that provides protection against basic chemical compounds. In some embodiments, the different sublayers 160_a_-160_d_ may be deposited using a same deposition technique, such as ALD, which may allow for fabrication of the entire multi-layer stack structure 160 in the same process chamber or otherwise without breaking vacuum in the process chamber.

The combination of different material compositions, thicknesses, and/or other characteristics of the respective sublayers 160_a_-60_d_ may be varied or otherwise customized for different applications or environments, and/or may provide a combination of characteristics for use in multiple applications or environments. For example, multi-layer environmental barrier structures 160 as described herein may include sublayers 160_a_-60_d_ with respective compositions that vary depending on environmental conditions or contaminants that may be specific to particular package types, such as the example package types shown in FIGS. 8A to 8C. It will be understood that the package types illustrated herein are provided by way of example rather than limitation. Additional example package types that may be associated with specific contaminants include, but are not limited to, through-hole-based, surface-mount-based, chip carrier, pin grid array, flat, Small Outline Integrated Circuit (SOIC), chip-scale, ball grid array, transistor/diode/small pin count IC, and/or multi-chip packages, including ceramic or plastic packages. As another example, multi-layer environmental barrier structures 160 as described herein may include sublayers 160_a_-60_d_ that are each configured to provide a diffusion barrier against respective conditions or contaminants, to provide a multi-layer environmental barrier 160 including a combination of sublayers 160_a_-160_d_ that may be universally applied in multiple different environments or applications.

Figure 2:
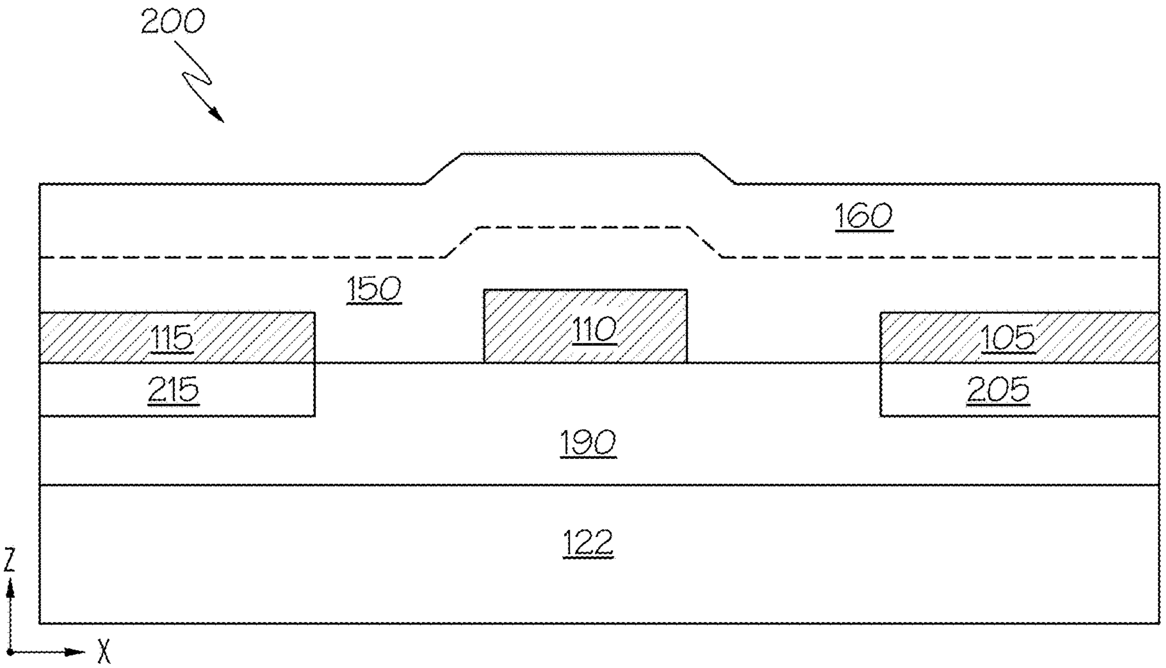
FIGS. 2, 3, and 4 are schematic cross-sectional views of transistor devices including a multi-layer environmental barrier according to some embodiments of the present invention.
Figure 3:
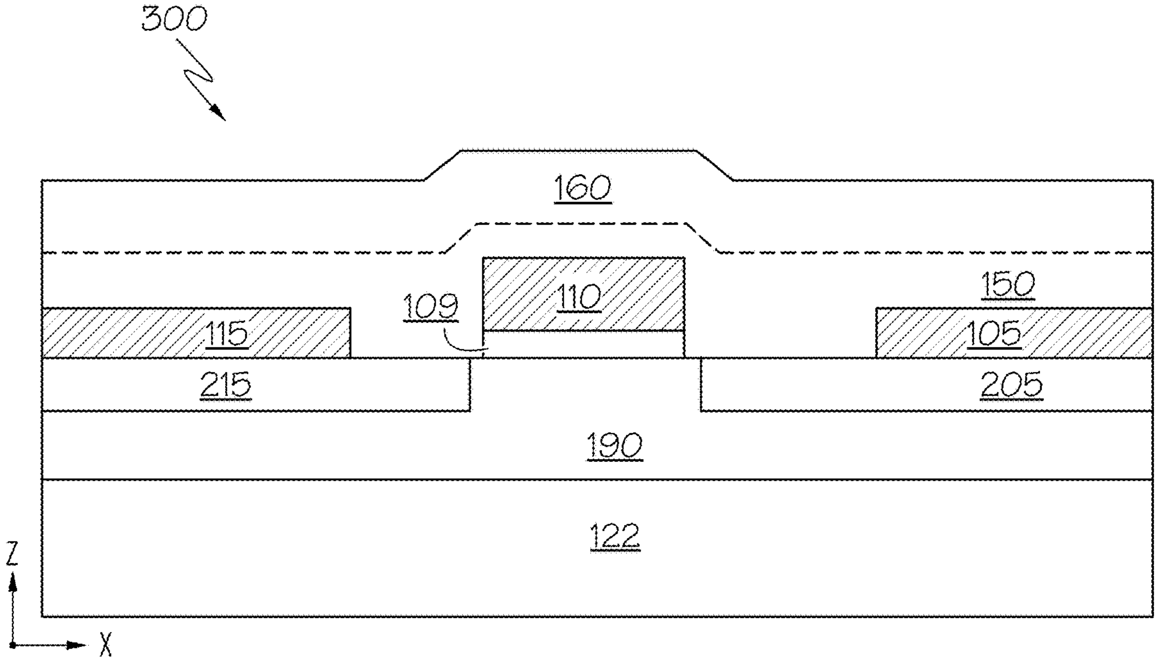
Figure 4:
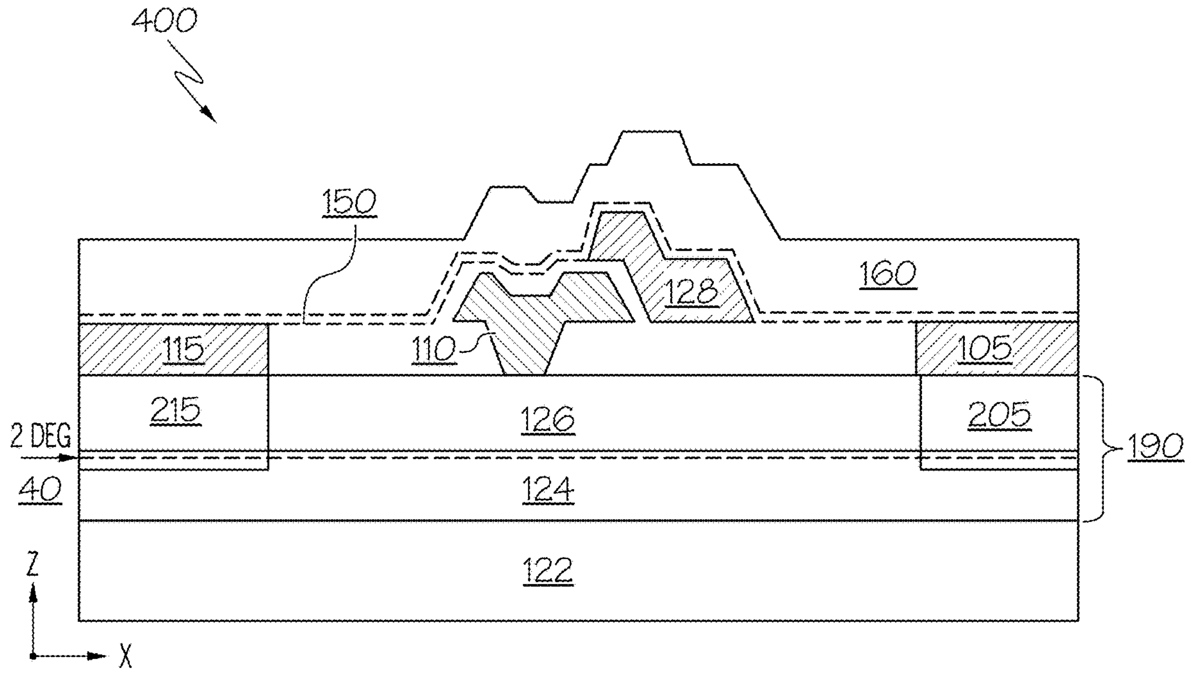

FIGS. 2, 3, and 4 are schematic cross-sectional views of transistor devices including a multi-layer environmental barrier according to some embodiments of the present invention. As shown in FIGS. 2, 3, and 4, transistor devices 200, 300, and 400 are formed on a substrate 122 such as, for example, a silicon carbide substrate. The illustrated devices 200, 300, 400 represent unit cell transistor structures of a semiconductor die, where hundreds or thousands of unit cell transistor structures may be formed on a semiconductor substrate 122 and electrically connected (e.g., in parallel). The substrate 122 may be a semi-insulating SiC substrate. However, embodiments of the present invention may utilize any suitable substrate, such as sapphire ($Al_2O_3$), aluminum nitride (AlN), aluminum gallium nitride (AlGaN), gallium nitride (GaN), silicon (Si), GaAs, LGO, zinc oxide (ZnO), LAO, indium phosphide (InP), and the like. The substrate 122 may be a SiC wafer, and the devices 200, 300, 400 may be formed, at least in part, via wafer-level processing, and the wafer may then be diced or otherwise singulated to provide a die including a plurality of the unit cell transistor structures.

The semiconductor body 190 may be a semiconductor layer structure including one or more layers formed by epitaxial growth. The layer(s) of the semiconductor body 190 may include one or more wide bandgap materials such as, for example, one or more Group III nitride-based layers. For example, the semiconductor body 190 may be formed of one or more layers of GaN or AlGaN. However, other Group III nitride materials may be used. As another example, both the substrate 122 and the semiconductor body 190 may be formed of SiC.

A source region 215 and a drain region 205 are formed in the semiconductor body 190, for example, by implanting appropriate ions into a surface of the semiconductor body 190 to achieve a desired doping concentration. A source contact 115 is formed by one or more metallic layers on the surface of the semiconductor body 190 over the source region 215. Likewise, a drain contact 105 is formed by one or more metallic layers on the surface of the semiconductor body 190 over the drain region 205. The source and drain contacts 115 and 105 may provide low-resistance ohmic contacts to the source and drain regions 215 and 205, respectively. A gate 110 is formed by one or more metallic layers on a surface of the semiconductor body 190 between the source region 215 and the drain region 205.

FIG. 2 illustrates a Metal-Semiconductor Field Effect Transistor (MESFET) device 200, where the region of the semiconductor body 190 between the source and drain regions 215 and 205 provides the conduction channel or channel region of the MESFET 200. FIG. 3 illustrates a Metal-Oxide Semiconductor Field Effect Transistor (MOSFET) device 300, where the region of the semiconductor body 190 between the source and drain regions 215 and 205 provides the channel region of the MOSFET 300, and the gate 110 is separated from the channel region by a gate oxide layer 109. FIG. 4 illustrates a High Electron Mobility Transistor (HEMT) device 400, where the semiconductor body 190 includes a lower bandgap channel layer 124 on the substrate 122, and a higher bandgap barrier layer 126 on the channel layer 124 opposite the substrate 122. A 2DEG conduction channel 40 can be induced in the region of the semiconductor body 190 between the source and drain regions 215 and 205 along the heterointerface between the channel layer 124 and the barrier layer 126. In some embodiments, the substrate 122 includes SiC the channel layer 124 includes GaN, and the barrier layer 126 includes AlGaN. A metal field plate 128 may also be provided, and in some embodiments may be electrically connected to the gate 110 (which may reduce the peak electric field, thereby increasing breakdown voltage and reducing high-field charge trapping effects), or may be electrically connected to the source contact 115 (which may reduce the gate-to-drain capacitance ($C_{gd}$), enhance gain, and/or improve linearity of the device 400).

One or more insulator layers (for example, one or more passivation layers) 150 are formed on the surface of the semiconductor body 190. The passivation layer(s) 150 may passivate surface states and/or otherwise improve electrical properties along the surface or interface with the semiconductor body 190. The passivation layer(s) 150 may include SiN, and may be deposited by a CVD process (such as PECVD) or other non-ALD process in some embodiments. While discussed primarily herein with reference to SiN passivation layer(s) 150, it will be understood that the passivation layer(s) 150 are not limited to SiN.

The transistor devices 200, 300, and 400 each include a multi-layer environmental barrier 160. An optional capping layer, such as the non-metal oxide- or nitride-based capping layer 170 of FIG. 1, is not shown for ease of illustration. The examples of FIGS. 2, 3, and 4 are intended to illustrate that the multi-layer environmental barrier 160 is not limited to use with any particular transistor structure, but rather, can be utilized as an environmental barrier for any suitable semiconductor device. As such, further details as to the operations of the devices 200, 300, and 400 will not be described in detail herein.

The multi-layer environmental barrier 160 includes multiple insulating sublayers (such as dielectric sublayers) having different characteristics (such as different material compositions and/or thicknesses). As shown in FIGS. 2, 3, and 4, the multi-layer environmental barrier layer 160 conformally covers the various elements of the transistor devices 200, 300, 400. In some embodiments, the multiple sublayers of the multi-layer environmental barrier 160 may be oxide layers of different materials that are deposited using the same process tool chamber, or otherwise without breaking vacuum in the process chamber. For example, the respective sublayers of the multi-layer environmental barrier 160 may be deposited using ALD, which may allow for deposition of a structure 160 including sublayers with a high degree of conformality and thickness uniformity in the same process chamber.

Using multiple sublayers of different material compositions and/or thicknesses as described herein may provide substantially improved environmental barrier properties as compared to some conventional environmental barriers, such as those including alternating oxide and nitride sublayers. Without being bound to any particular theory, it has been recognized that such SiN sublayers may be susceptible to oxidation, etching, and/or corrosion in the presence of contaminant halogens, such as F— and Cl—. In addition, it has been recognized that ALD-based layers may offer improved conformality, which may be beneficial and/or critical for humidity protection; however, SiN is typically deposited by CVD, which may result in defects (e.g., pin holes, columnar structures). Also, deposition of conventional alternating oxide and nitride sublayers in the same may be problematic, due to cross-contamination issues. It has been further recognized that thicker and/or denser insulating films or sublayers (such as insulating metal oxides) may provide improved contaminant ingress protection. For example, AlO—, HfO—, and/or ZrO-based layers may have a higher density than SiN-based layers, and may provide better humidity protection. As such, in some embodiments, one or more sublayers of different insulating materials may be alternatingly stacked with (or may replace) conventional oxide or nitride sublayers to provide a multi-layer environmental barrier with different diffusion barrier properties, and thus, improved resistance to oxidation, etching, and/or corrosion with respect to multiple different contaminants or combinations of different contaminants.

The multiple material environmental barrier stack can be customized to address humid environments with different contaminant compositions, e.g. to provide a barrier to elements or chemicals other than (or in addition to) water. In some embodiments, at least one of the sublayers may differ in density and/or thickness from the materials of at least one other of the sublayers of the multi-layer environmental barrier. For example, respective insulating materials of at least one of the sublayers may have a density that is greater than SiN. In addition, non-metal insulating films or sublayers may be included in the stack to provide desired chemical processing protection. Combinations of stacked sublayers of different material compositions and/or different thicknesses (e.g., in repeating or periodic layer structures) as described herein can thus better protect against contaminant ingress and/or damage, while simultaneously providing protection against subsequent fabrication processes.

FIGS. 5A, 5B, 5C, 5D, and 5E are enlarged views of a transistor device illustrating various combinations of sublayers in multi-layer environmental barriers according to some embodiments of the present invention in greater detail. While shown in FIGS. 5A to 5E with reference to binary periodic structures 160', 160'', 160''', $\mathbf{160^{(4)}}$, $\mathbf{160^{(5)}}$ including first and second sublayers alternatingly stacked on an optional passivation layer or layer structure 150, it will be understood that these structures 160', 160'', 160''', $\mathbf{160^{(4)}}$, $\mathbf{160^{(5)}}$ are illustrated by way of example only, and that multi-layer environmental barriers 160', 160'', 160''', $\mathbf{160^{(4)}}$, $\mathbf{160^{(5)}}$, $\mathbf{160^{(6)}}$ (collectively 160) as described herein may include more than two sublayers having different characteristics (e.g., defining a ternary structure, a quaternary structure), and/or may be stacked in non-repeating layer structures or repeating layer structures that are periodic or non-periodic.

Figure 5A:
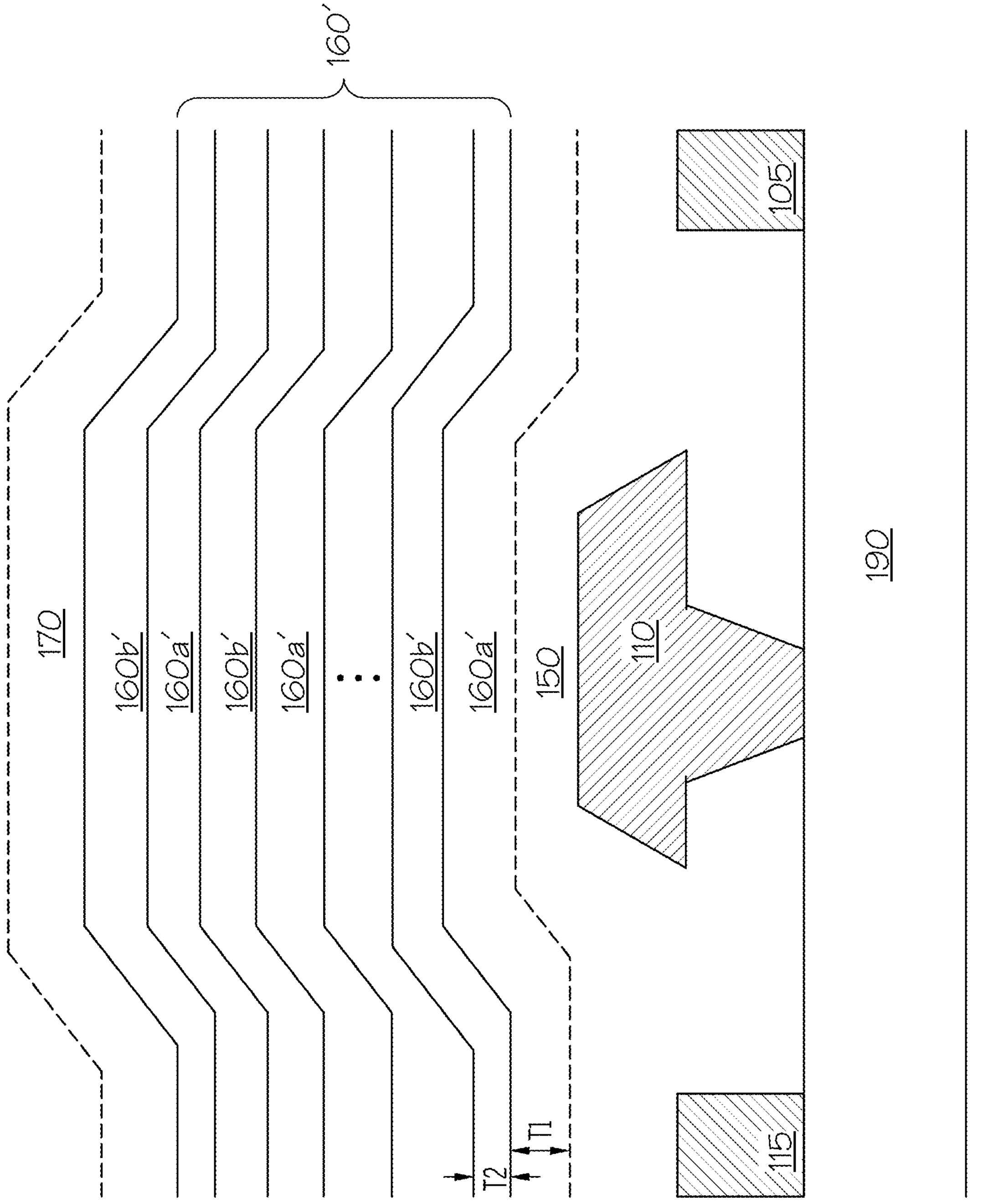
FIGS. 5A, 5B, 5C, 5D, and 5E are enlarged views of a transistor device illustrating sublayers of multi-layer environmental barriers according to some embodiments of the present invention in greater detail.

In the example of FIG. 5A, the multi-layer environmental barrier 160' includes a stack of sublayers **160*a*', 160*b*' of respective insulating materials that are alternatingly stacked to define periodic repeating layer structure, with each period including a first sublayer 160*a*' and a second sublayer 160*b*'. One of the respective insulating materials of the first and second sublayers 160*a*', 160*b*' may have a comparatively higher density than the other. One or more of the sublayers 160*a*', 160*b*' may have a density that is greater than that of SiN. Another of the sublayers 160*a*', 160*b*' may have a density that is less than or equal to that of SiN. In FIG. 5A, the first sublayer 160*a*' includes a comparatively higher-density insulating material, and the second insulating sublayer 160*b*' includes a comparatively lower-density material. For example, the first insulating sublayer 160*a*' may include a metal insulating material, such as aluminum oxide (AlO), hafnium oxide (HfO), or zirconium oxide (ZrO), or other metal-rich insulating material. That is, examples of metal insulating materials or layers may include, but are not limited to, metal oxides (e.g., AlO, HfO, ZrO), or metal nitrides. The second insulating sublayer 160*b*'** may include a non-metal insulating material, for example, a semiconductor oxide or nitride, such as silicon oxide (SiO) or silicon nitride (SiN), or other metal-poor insulating material. As noted above, examples of non-metal insulating materials or layers may include, but are not limited to, metalloid oxides (e.g., BOx, SiOx, GeOx, AsOx, SbOx, TeOx) and metalloid nitrides (e.g., SiN). Materials described herein with reference to compound chemical formulas (e.g., SiO) may include different stoichiometries or any compound of the constituent elements, and amorphous or crystalline states of the materials. Typical densities of SiO, SiN, AlO, ZrO, and HfO are 2.65, 3.17, 3.95, 5.68, and 9.68 grams per cubic centimeter (g/cm$^3$), respectively. That, is with respect to material density, HfO>ZrO>AlO>SiN>SiO. Generally, a denser film may provide better water or other contaminant ingress prevention. For example, HfO and ZrO are denser than AlO and SiN and SiO, and thus, may better impede contaminant ingress.

Figure 5B:
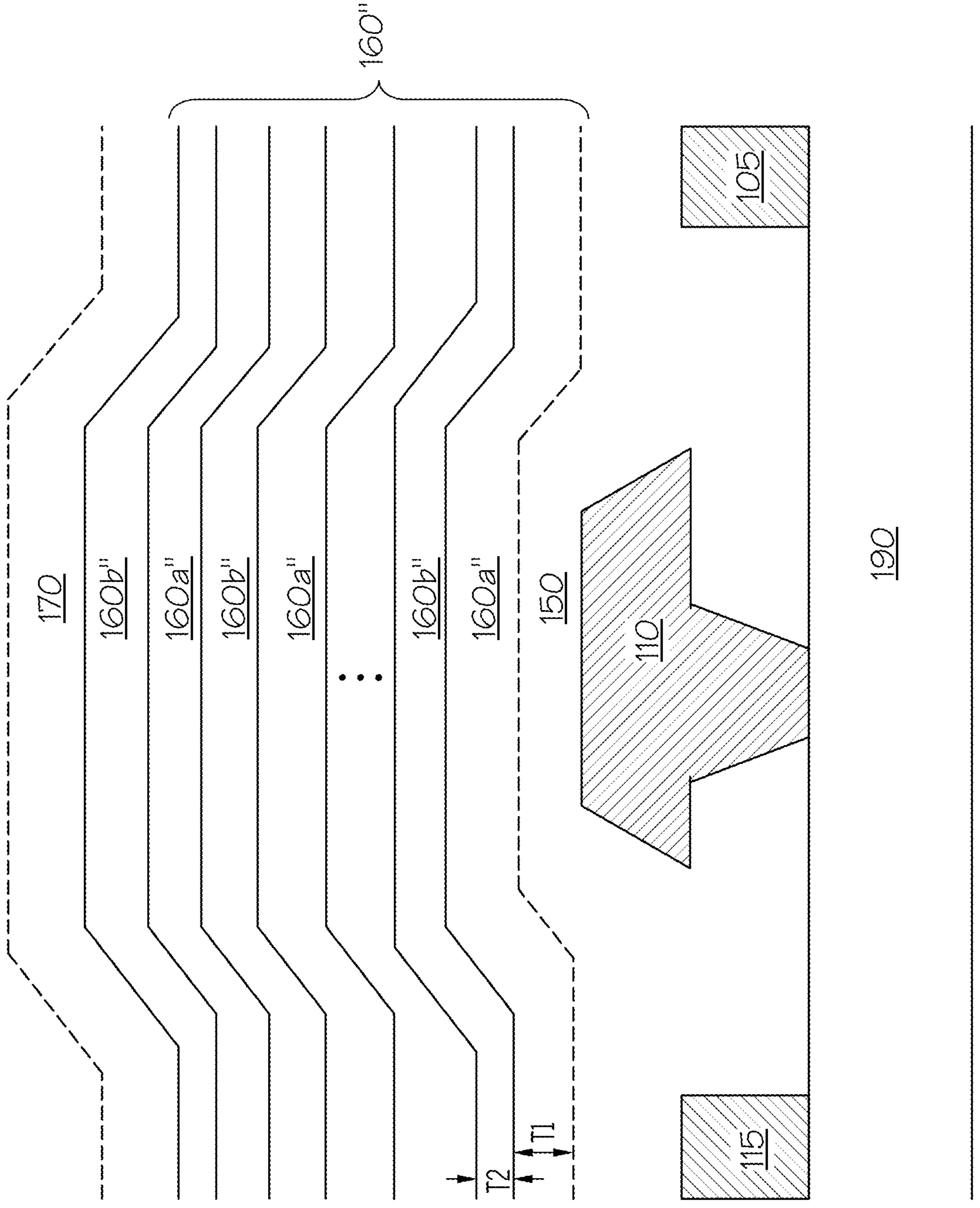
Figure 5C:
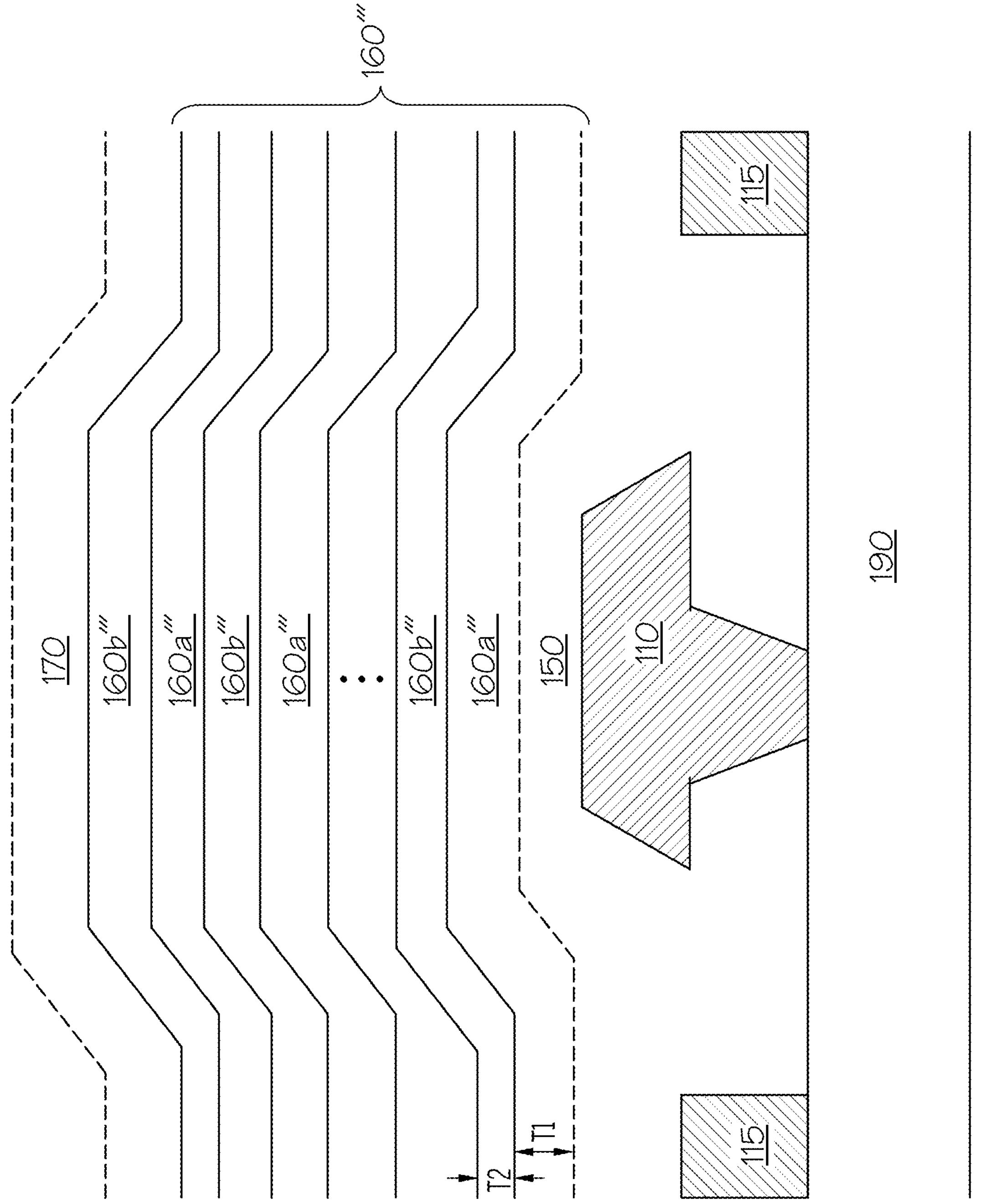
Figure 5D:
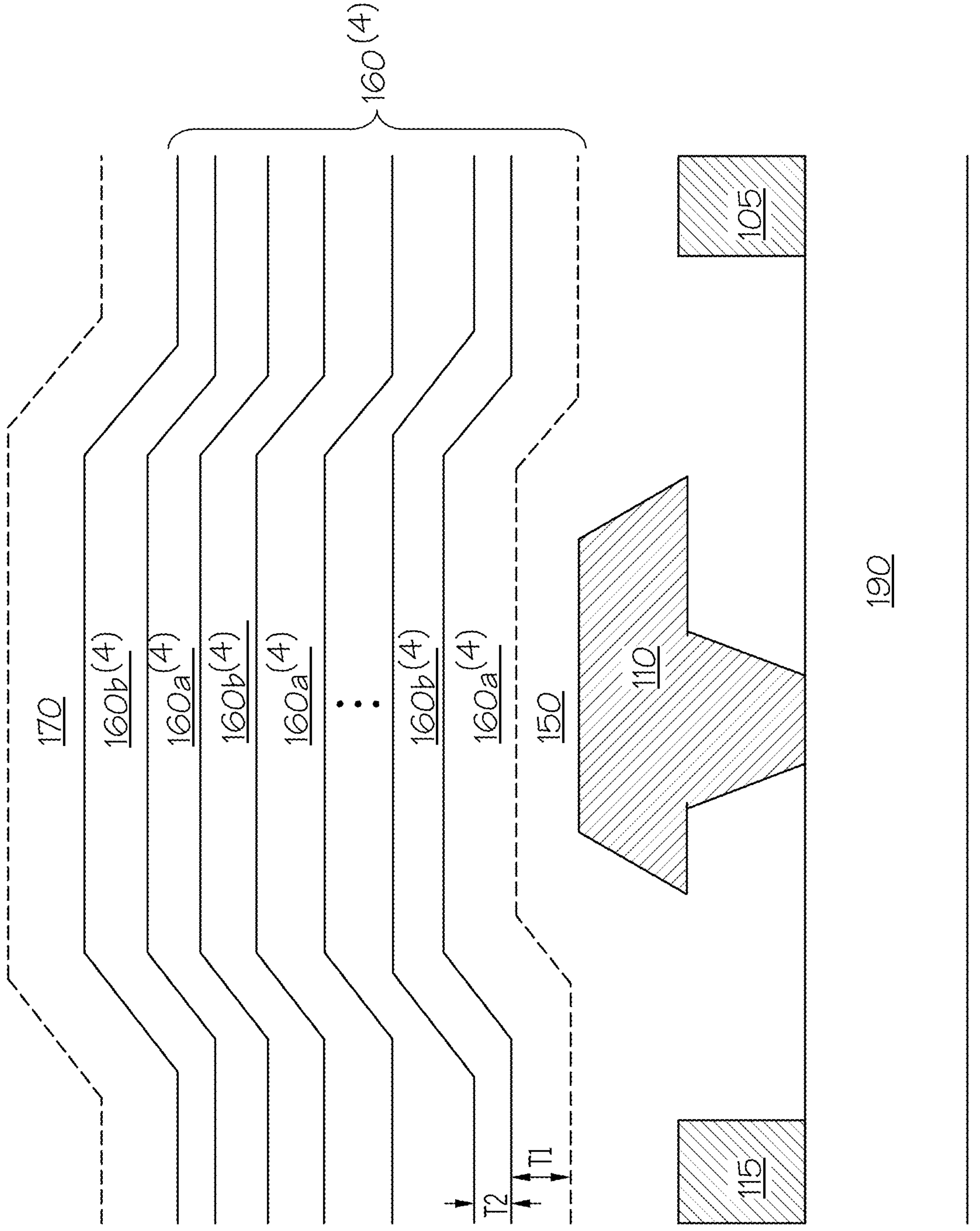
Figure 5E:
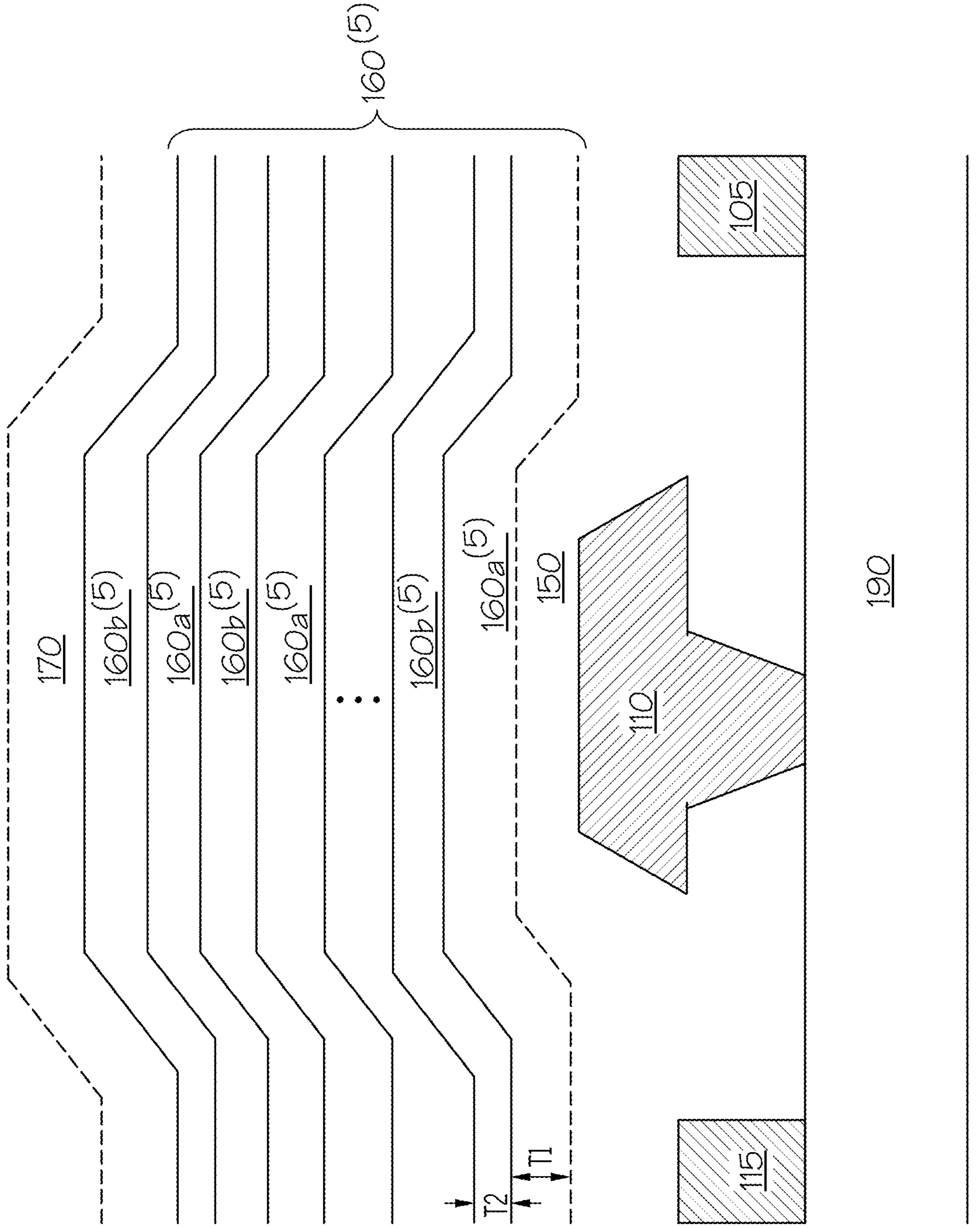

In the example of FIG. 5B, the multi-layer environmental barrier 160" includes a stack of sublayers 160*a*", 160*b*" of respective oxide materials that are alternatingly stacked to define periodic repeating layer structure, with each period including a first oxide sublayer 160*a*" and a second oxide sublayer 160*b*". The respective oxide materials of the first and second oxide sublayers 160*a*", 160*b*" may differ from one another in material composition. For example, the first oxide sublayer 160*a*" may include AlO, HfO, or ZrO, while the second oxide sublayer 160*b*" may include SiO. FIG. 5C illustrates a more specific example of the multi-layer environmental barrier 160''' including a first sublayer 160*a*''' of an insulating metal oxide material or layer (e.g., AlO, HfO, or ZrO) and a second sublayer 160*b*''' of an insulating non-metal oxide material or layer (e.g., SiO) alternatingly stacked in a periodic repeating layer structure. The multi-layer environmental barrier 160''' including the first and second sublayers 160*a*''' and 160*b*''' alternatingly stacked may thus alleviate the susceptibility to oxidation, etching, and/or corrosion of the non-metal oxide sublayers 160*b*'''. In the example of FIG. 5D, the multi-layer environmental barrier 160$^{(4)}$ includes a stack of sublayers 160*a*$^{(4)}$, 160*b*$^{(4)}$ of respective nitride materials that are alternatingly stacked to define periodic repeating layer structure, with each period including a first nitride sublayer 160*a*$^{(4)}$ and a second nitride sublayer 160*b*$^{(4)}$, where the respective nitride materials of the sublayers 160*a*$^{(4)}$, 160*b*$^{(4)}$ may differ from one another in material composition. FIG. 5E illustrates another example of the multi-layer environmental barrier 160$^{(5)}$ including a first sublayer 160*a*$^{(5)}$ of an insulating metal oxide material (e.g., AlO, HfO, or ZrO) and a second sublayer 160*b*$^{(5)}$ of a metal material (e.g., Al, Au) alternatingly stacked in a periodic repeating layer structure, where the metal sublayers 160*b*$^{(5)}$ may provide more effective barriers to humidity ingress.

As shown in FIGS. 5A to 5E, at least two of the sublayers of each period of the multi-layer environmental barrier 160 may have different thicknesses from one another. For example, a ratio of a thickness T1 of the first sublayer 160*a*'/160*a*"/160*a*'''/160*a*$^{(4)}$/160*a*$^{(5)}$/160*a*$^{(6)}$ (collectively 160*a*) to a thickness T2 of a second sublayer 160*b*'/160*b*"/160*b*'''/160*b*$^{(4)}$/160*b*$^{(5)}$/160*a*$^{(6)}$ (collectively 160*b*) may be greater than 2:1, greater than 5:1, greater than 8:1, or greater than 10:1 in some embodiments. The thickness ratios of the sublayers 160*a*, 160*b* may be dependent or based on the respective densities of the different insulating materials. For example, in the illustrated binary periodic layer structures, the first, higher-density material sublayer 160*a*' may be deposited with a thickness T1 that is greater than the thickness T2 of the second, lower-density material sublayer 160*b*'. Similarly, a multi-layer environmental barrier 160 including a ternary periodic layer structure or quaternary periodic layer structure may include three sublayers or four sublayers, respectively, where at least two of the sublayers in each period may differ in thickness.

While illustrated with reference to various sublayer material combinations in FIGS. 5A to 5E, it will be understood that multi-layer environmental barriers according to embodiments of the present invention are not limited to these specific materials. For example, in some embodiments, the sublayers 160*a*, 160*b* may include organic materials and inorganic materials alternatingly stacked to define the multi-layer environmental barrier 160. In particular, in FIG. 5B, one of the oxide layers 160*a*", 160*b*" may be replaced by an organic material sublayer to define an alternating organic sublayer/oxide sublayer multi-layer environmental barrier 160". Likewise, in FIG. 5B, one of the nitride layers 160*a*$^{(4)}$, 160*b*$^{(4)}$ may be replaced by an organic material sublayer to define an alternating organic sublayer/nitride sublayer multi-layer environmental barrier 160$^{(4)}$.

More generally, the multi-layer environmental barrier 160 illustrated in FIGS. 5A to 5E may include two or more sublayers 160*a*, 160*b* having different material compositions and the same thickness, same material compositions and different thicknesses, or different material compositions and different thicknesses. The two or more sublayers 160*a*, 160*b* may be stacked in repeating or non-repeating layer structures. The repeating layer structures may be periodic (having two or more periods) or non-periodic.

In particular embodiments of the multi-layer environmental barriers 160 shown in FIGS. 5A to 5C, the first sublayer 160*a* of each period may be AlO, and the second sublayer 160*b* of each period may be SiO. The SiO sublayers may be amorphous layers (e.g., silica) or crystalline (e.g., $SiO_2$). Likewise, the AlO sublayers may be amorphous layers (e.g., alumina) or crystalline layers (e.g., $Al_2O_3$). AlO may be relatively stable, and may be relatively easy to fabricate in comparison to some nitride materials (e.g., SiN) using widely available deposition tools. AlO may also have a higher density than SiN, and thus may provide an improved moisture barrier. The AlO sublayers may be multiple times thicker than the SiO sublayers, for example, as the deposition rate and/or density for AlO may be many times that of SiO. For example, the thickness T2 of the SiO sublayer may be less than about one-fourth or less than about one-fifth of the thickness T1 of the AlO sublayer in some embodiments. In particular embodiments, the respective thicknesses T1 and T2 of AlO and SiO sublayers in a multi-layer environmental barrier as described herein may be about 2 to 8 nm and 1 nm, respectively, such that the thickness ratio of AlO to SiO may be, for example, about 2:1 or more, about 5:1 or more, or about 8:1 or more.

Still referring to FIGS. 5A to 5E, a non-metal insulating layer, such as SiO or SiN, may be included as or on a topmost sublayer 160*b* of the multi-layer environmental barrier 160. For example, SiO may protect the underlying sublayers of the multi-layer environmental barrier structure 160 in further chemical processing, which may rely on basic (rather than acidic) chemistries. In some embodiments, the non-metal insulating layer may be implemented by the topmost sublayer 160*b* of the multi-layer environmental barrier 160. In other embodiments, the non-metal insulating layer may be implemented by an additional SiO or SiN capping layer 170 that is formed on the topmost sublayer 160*b* of the multi-layer environmental barrier 160. That is, a surface of the multi-layer environmental barrier 160 opposite the passivation layer 150 may be a non-metal insulating layer, or may have a non-metal insulating layer thereon.

In some embodiments, two or more sublayers of the multi-layer environmental barrier 160 may be formed by a conformal deposition process, such ALD. An ALD (sub) layer or ALD material may refer to a layer or material that is formed by ALD, including, but not limited to thermal ALD and plasma-enhanced ALD (PEALD) processes. The use of ALD to form multiple (or all) sublayers in the multi-layer stack 160 may allow for sublayers with a substantially uniform thickness that conformally extend along the underlying surface, thinner and with better step coverage than may be achieved by CVD. For example, ALD may achieve up to 100% conformality, in comparison to CVD sidewall coverage of about 80% of the top or planar thickness. As described herein, conformality of a layer along a particular surface may be expressed as a percentage of the thickness of the layer when deposited on a planar surface. ALD processes may also be advantageous in forming multilayer stacks by allowing for fabrication of multiple thin sublayers in the same chamber, without additional wafer transfers (i.e., without breaking vacuum) and resets between the sub-steps (e.g., to avoid cross contamination).

Figure 6C:
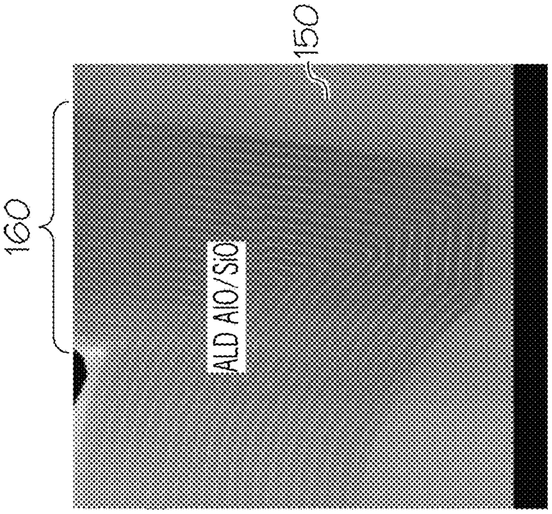
FIGS. 6A, 6B, and 6C are STEM images illustrating cross-sectional views of transistor devices including a multi-layer environmental barrier according to some embodiments of the present invention. In particular.
Figure 6B:
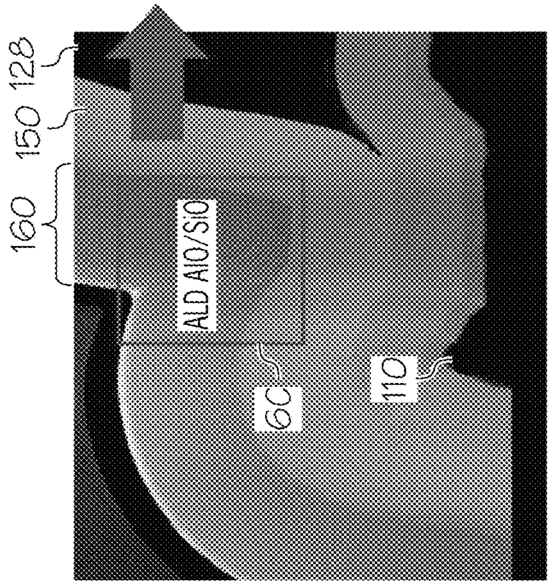
Figure 6A:
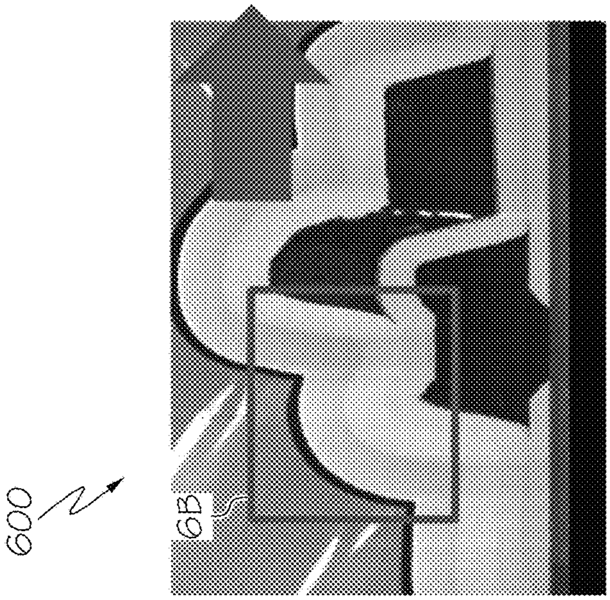

FIGS. 6A, 6B, and 6C are STEM images illustrating cross-sectional views of transistor devices including a multilayer environmental barrier formed of ALD oxide sublayers according to some embodiments of the present invention. In particular, FIG. 6A is a cross-sectional view of a HEMT device 600. FIG. 6B is an enlarged view of the passivation layer 150 and multi-layer environmental barrier 160 shown in FIG. 6A. FIG. 6C is an enlarged view of the multi-layer environmental barrier 160 shown in FIG. 6B.

As shown in FIGS. 6A to 6C, the multi-layer environmental barrier 160 may be a binary stack including alternating sublayers of ALD SiO and ALD AlO. The ALD process may allow for deposition of AlO and SiO sublayers of substantially uniform thickness and high conformality (e.g., more than 80% and up to about 100% of a planar surface thickness). In particular, FIG. 6B illustrates that the AlO/SiO environmental barrier 160 substantially conforms to the shape of the underlying passivation layer 150, which is formed on the gate 110 and the field plate 128. Each of the AlO and SiO sublayers has a substantially uniform thickness and conformally extends along the shape defined by the passivation layer 150 and the underlying gate 110 and field plate 128 structures.

The AlO sublayers may have a relatively higher density and may thus provide improved humidity robustness as well improved protection against oxidation, etching, and/or corrosion by contaminant halogens, in comparison to SiN. The alternating SiO sublayers may define multiple AlO/SiO interfaces with the AlO layers, which can reduce or prevent defects and/or contaminants of one sublayer from propagating to the next sublayer in the stack 160. The SiO sublayers may also provide protection in subsequent processing (e.g., against basic etch chemistries). Additionally or alternatively, the multi-layer environmental barrier 160 may include sublayers of ALD HfO, ZrO, and/or SiN. In the example device 600 shown in FIGS. 6A to 6C, the topmost or terminating layer in the multi-layer environmental barrier 160 is an SiO sublayer. However, in other embodiments, an additional SiO or SiN capping layer 170 may be formed on the topmost sublayer of the multi-layer environmental barrier 160.

Figure 7A:
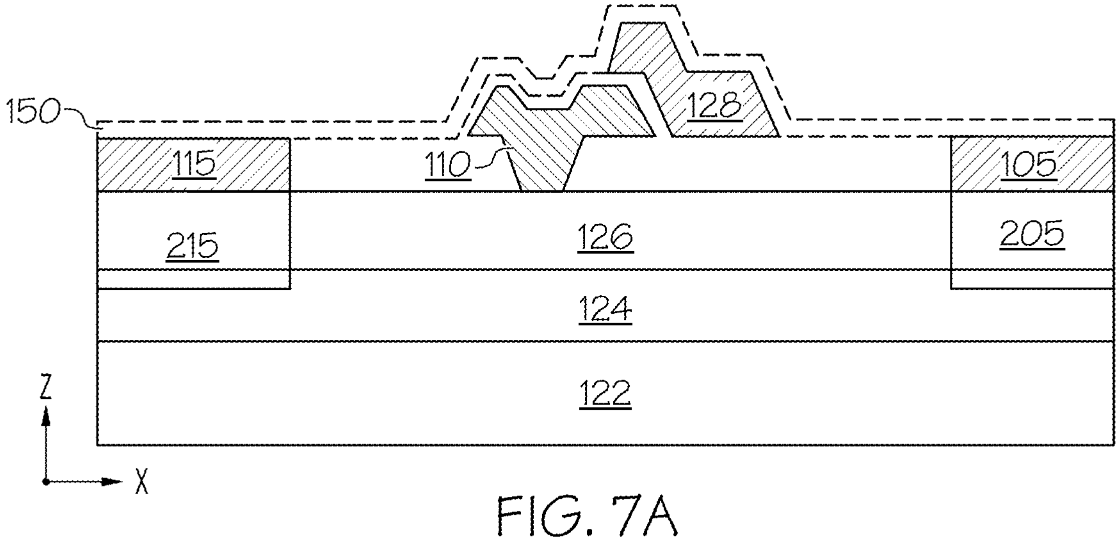
FIGS. 7A, 7B, 7C, and 7D are cross-sectional views illustrating intermediate fabrication steps in methods of fabricating a multi-layer environmental barrier on a transistor device according to some embodiments of the present invention.

FIGS. 7A, 7B, 7C, and 7D are cross-sectional views illustrating intermediate fabrication steps in methods of fabricating a multi-layer environmental barrier on a semiconductor device according to some embodiments of the present invention. As shown in FIG. 7A, a transistor structure includes a gate 110, source contact 115, and drain contact 105 on a semiconductor body 190 (illustrated in this example with reference to the HEMT device 400 of FIG. 4, including a channel layer 124 and a barrier layer 126 on a substrate 122). A passivation layer or layer structure 150, such as a SiN-based passivation layer, is formed on the gate 110 and portions of the semiconductor body 190 between the gate and the source and drain contacts 115 and 105.

A metal field plate 128 is formed on the passivation layer(s) 150. While illustrated as including a stepped profile conformally extending along the passivation layer(s) 150 with a first step portion adjacent or overlapping the gate 110 and a second step portion adjacent the drain contact 105, the field plate 128 may be implemented in various configurations in accordance with embodiments of the present invention. For example, the field plate 128 may have a substantially planar profile extending along a portion of the passivation layer(s) 150 between the gate 110 and drain contact 105 or between the gate 110 and source contact 115, and/or may be laterally spaced apart from the gate 110 so as to be free of overlap with the gate 110 in the vertical direction (Z-) direction.

Figure 7B:
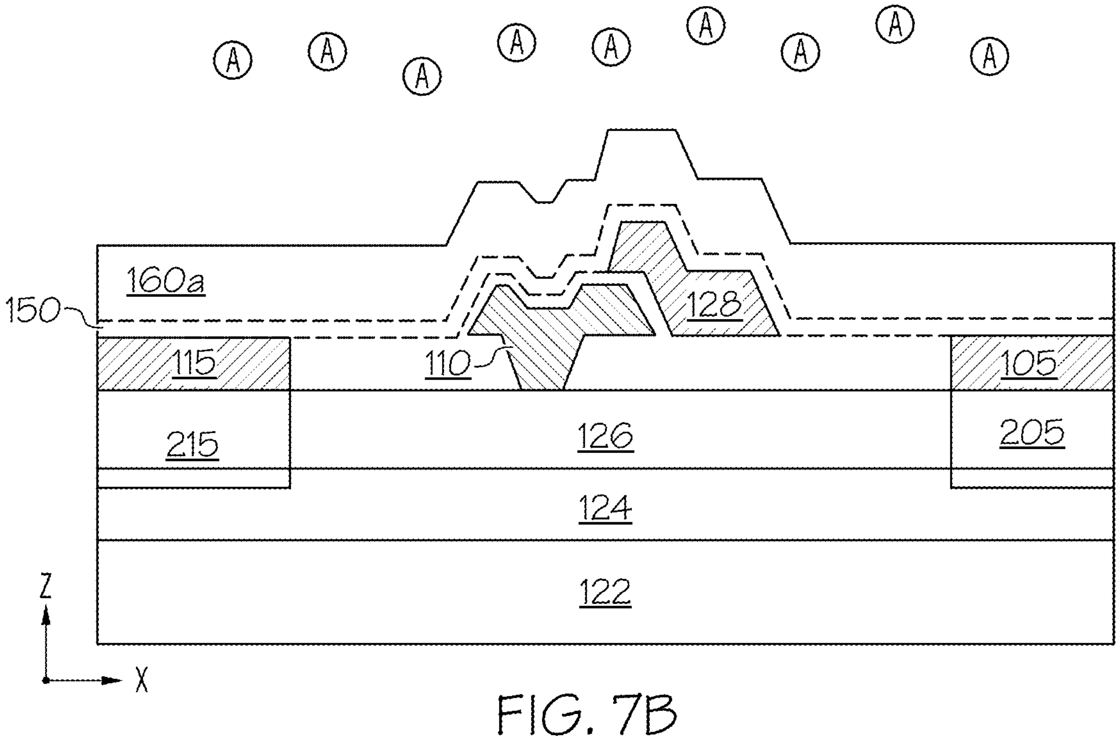
Figure 7C:
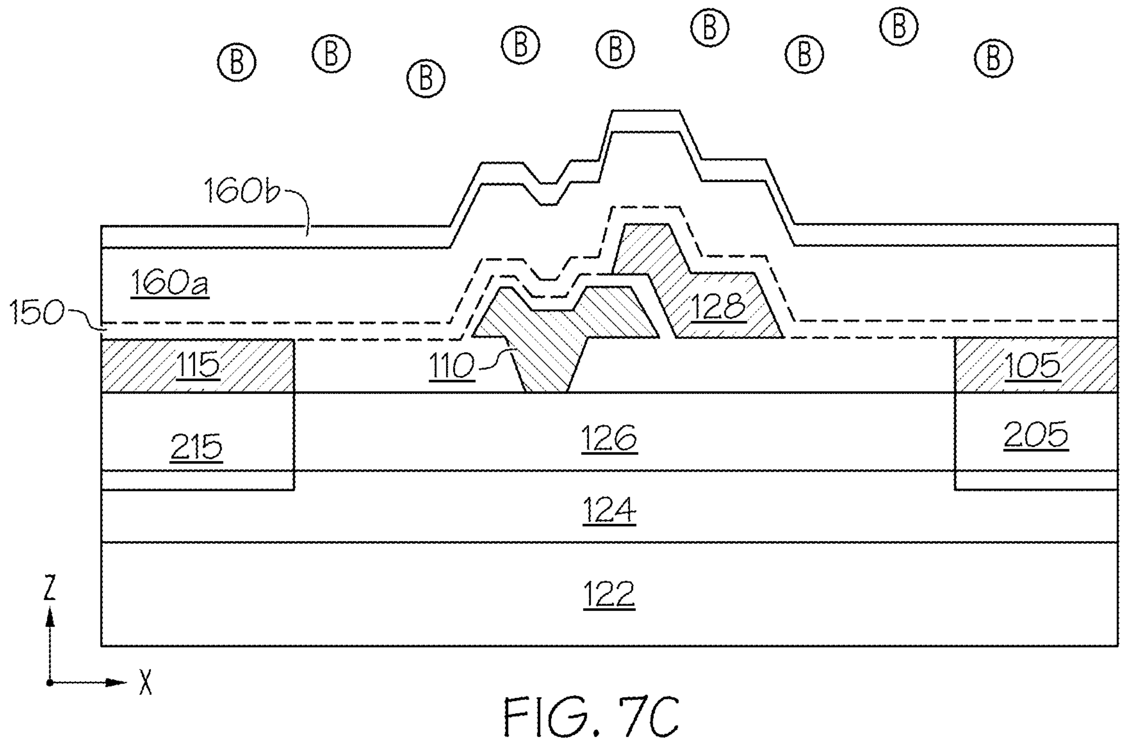

As shown in FIGS. 7B and 7C, an ALD process is performed to conformally deposit a first insulating sublayer 160*a* on the surface of the passivation layer(s) 150, and to conformally deposit a second insulating sublayer 160*b* on the surface of the first insulating sublayer 160*a*. For example, the first insulating sublayer 160*a* may include a metal insulating material, such as AlO, HfO, ZrO, or other metal oxide or insulating layer having a greater density than SiN. In some embodiments, the second insulating sublayer 160*b* may include a non-metal insulating material, such as SiO, SiN, or other non-metal oxide or insulating layer having a density less than or equal to SiN.

Figure 7D:
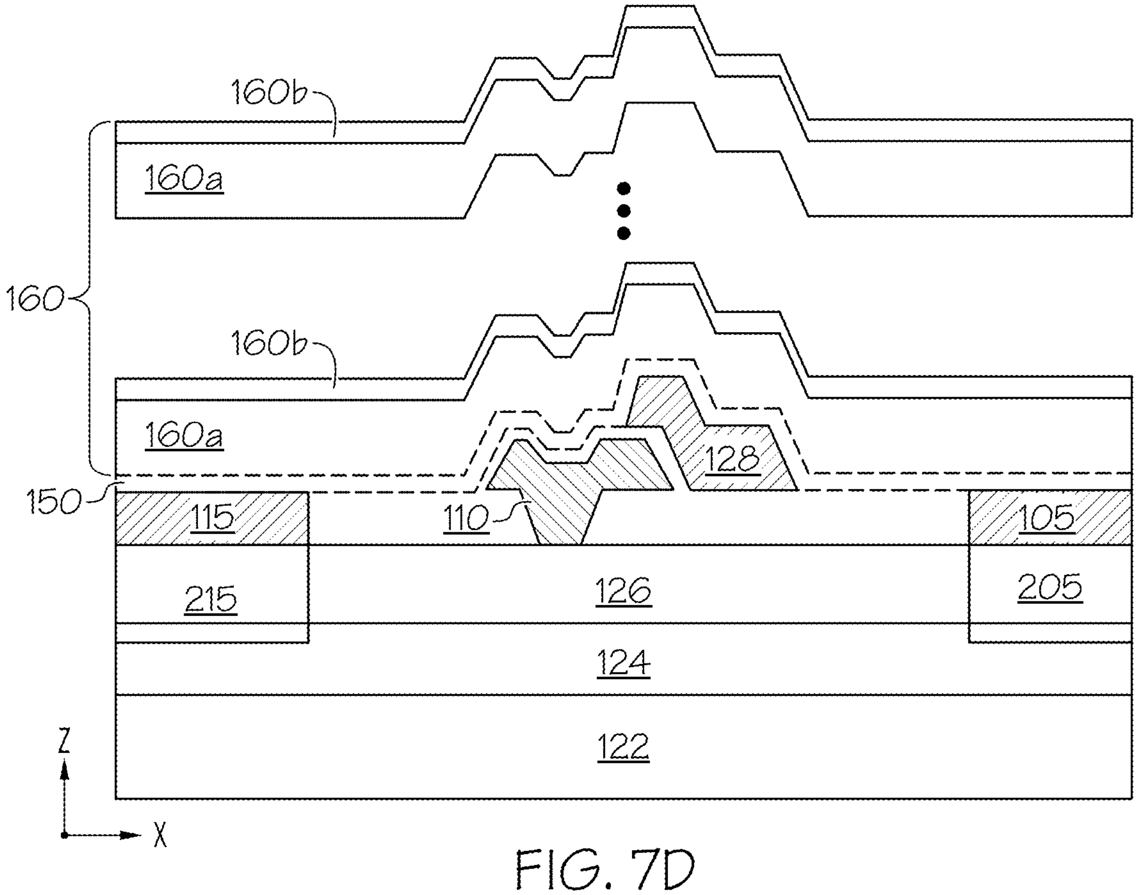

The ALD process may rely on alternated, self-limiting reactions between gaseous reactants and an exposed solid surface to deposit highly conformal insulating sublayers 160*a*, 160*b* with a substantially uniform thickness, which may be controllable at the submonolayer level. In particular, the semiconductor body 190 including the features 105, 110, 115, 128, and 150 formed thereon is exposed to two reactants, A (in FIG. 7B) and B (in FIG. 7C) in a sequential, non-overlapping manner in a process chamber. In FIG. 7B, reactant A reacts with a finite number of reactive sites on the exposed surfaces of the semiconductor body 190 and features to define the first sublayer 160*a*, and growth stops once the finite number of sites have been consumed, in a self-limiting manner. The remaining amounts of reactant A are evacuated from the chamber, and reactant B is introduced in FIG. 7C, without breaking vacuum in the chamber. Reactant B likewise reacts with a finite number of reactive sites on the exposed surfaces to define the second sublayer 160*b*, growth stops once the finite number of sites have been consumed, and the remaining amounts of reactant B are evacuated from the chamber. By alternating exposures to reactants A and B, a thin film multi-layer environmental barrier 160 including alternating sublayers 160*a* and 160*b* is deposited, as shown in FIG. 7D.

The ALD process deposits the sublayers 160*a* and 160*b* with a substantially uniform thickness and with high conformality on the complex underlying shapes or structures. For example, ALD may achieve conformality of up to 100% of the thickness of the planar portions of the sublayers 160*a* and 160*b*. ALD processes may also be advantageous in forming the multi-layer stack 160 by allowing for fabrication of multiple thin sublayers 160*a*, 160*b* in the same chamber, without additional wafer transfers (i.e., without breaking vacuum) and resets between the sub-steps (e.g., to avoid cross contamination).

In some embodiments, at lower temperatures, the ALD processes as shown in FIGS. 7B and 7C may produce amorphous films, which may be subsequently crystallized. For example, in some embodiments the first sublayer 160*a* may be deposited as amorphous AlO (also denoted as AlOx), which may be crystalized to form $Al_2O_3$. The second sublayer 160*b* may be deposited as amorphous SiO (also denoted as SiOx), which may be crystalized to form $SiO_2$. A non-metal oxide layer, such as SiO or SiN, may be formed as the topmost sublayer 160*b* of the multi-layer environmental barrier 160, or on the topmost sublayer 160*b* (e.g., as capping layer 170), using an ALD or a non-ALD process.

As noted above, multi-layer environmental barrier structures 160 as described herein may include sublayers having respective compositions that are selected based on environmental conditions/contaminants, which may be application-specific. For example, the environmental conditions/contaminants may be specific to particular semiconductor package types, including ceramic or plastic packages, such as open cavity, overmold, thermally-enhanced, through-hole-based, surface-mount-based, chip carrier, pin grid array, flat, Small Outline Integrated Circuit (SOIC), chip-scale, ball grid array, transistor/diode/small pin count IC, and/or multi-chip packages. As such, some embodiments described herein may provide multi-layer environmental barrier structures 160 including sublayers of respective materials that may be targeted to address specific package technologies.

Figure 8A:
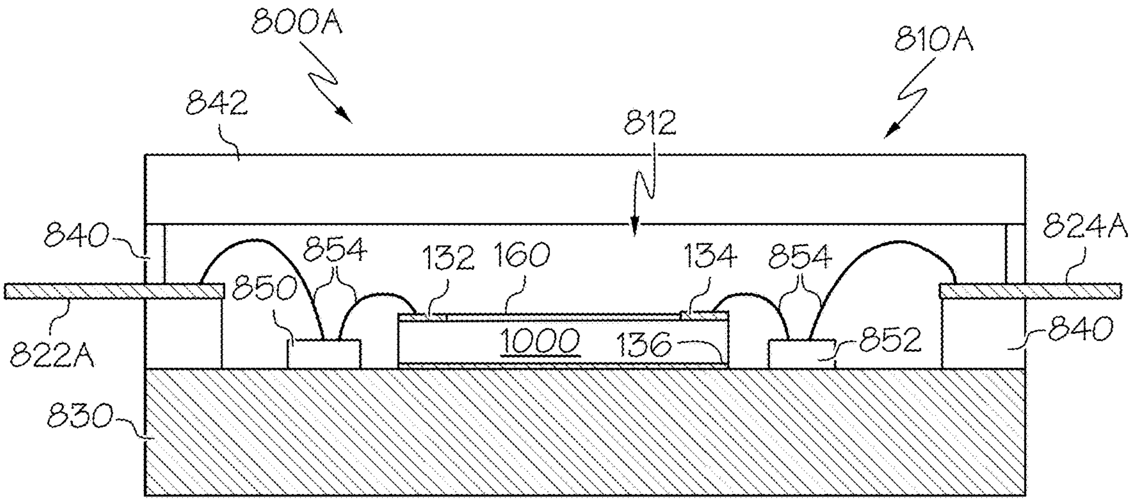
FIGS. 8A, 8B, and 8C are schematic cross-sectional views illustrating several example packages including transistor devices according to embodiments of the present invention to provide packaged transistor amplifiers.
Figure 8B:
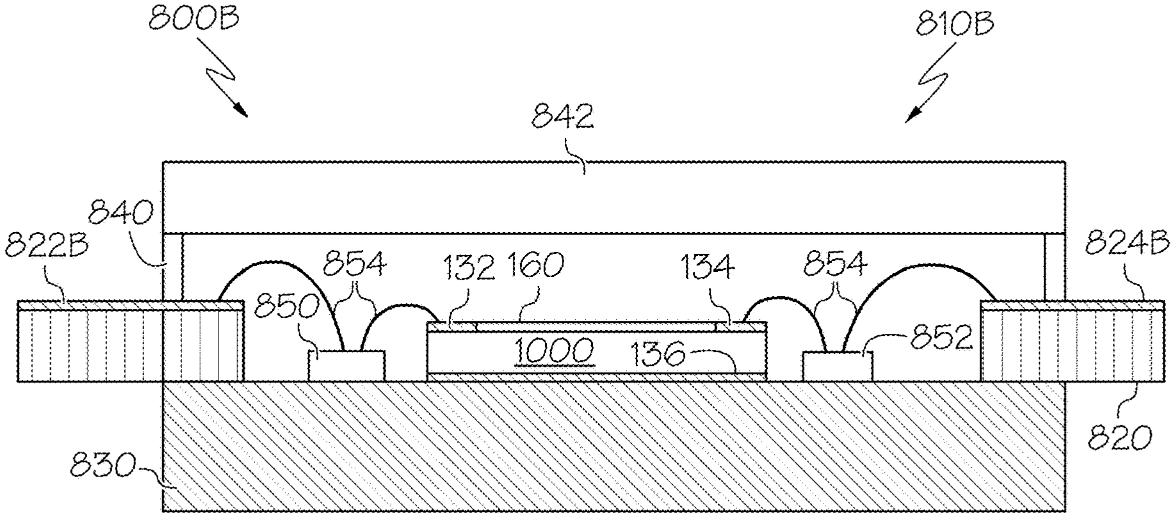
Figure 8C:
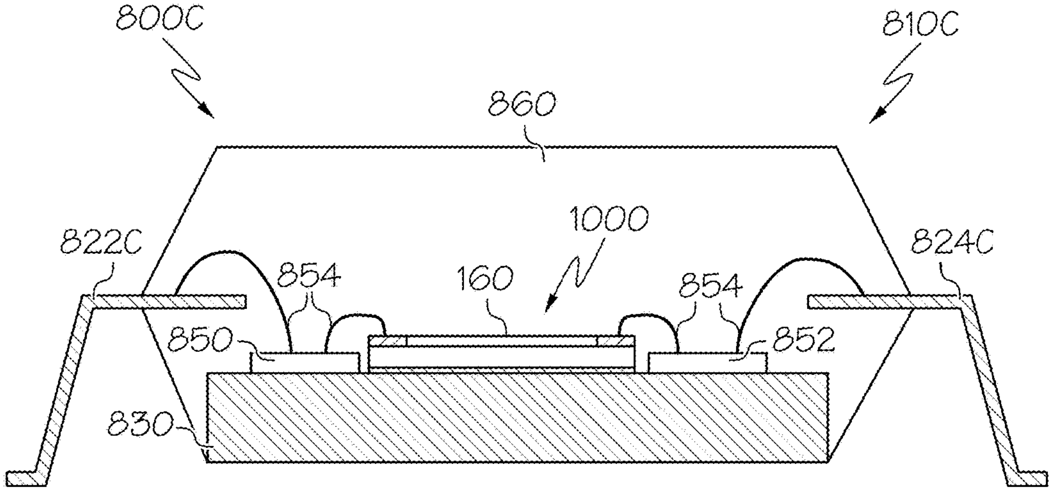

FIGS. 8A, 8B, and 8C are schematic cross-sectional views illustrating several example package types 800A, 800B, 800C, where each package technology 800A, 800B, 800C may include its own specific ionic or other contaminant content. FIGS. 8A-8C show packaging of a transistor device 1000, which may include any of the transistor structures 200, 300, 400 described herein.

In particular, FIG. 8A is a schematic side view of a package 800A for a Group III nitride-based RF transistor amplifier. As shown in FIG. 8A, packaged RF transistor amplifier 800A includes the RF transistor amplifier die 1000 packaged in an open cavity package structure 810A. The package structure 810A includes metal gate leads 822A, metal drain leads 824A, a metal submount 830, sidewalls 840 and a lid 842.

The submount 830 may include materials configured to assist with the thermal management of the package 800A. For example, the submount 830 may include copper and/or molybdenum. In some embodiments, the submount 830 may be composed of multiple layers and/or contain vias/interconnects. In an example embodiment, the submount 830 may be a multilayer copper/molybdenum/copper metal flange that comprises a core molybdenum layer with copper cladding layers on either major surface thereof. In some embodiments, the submount 830 may include a metal heat sink that is part of a lead frame or metal slug. The sidewalls 840 and/or lid 842 may be formed of or include an insulating material in some embodiments. For example, the sidewalls 840 and/or lid 842 may be formed of or include ceramic materials. In some embodiments, the sidewalls 840 and/or lid 842 may be formed of, for example, $Al_2O_3$. The lid 842 may be glued to the sidewalls 840 using an epoxy glue. The sidewalls 840 may be attached to the submount 830 via, for example, braising. The gate lead 822A and the drain lead 824A may be configured to extend through the sidewalls 840, though embodiments of the present invention are not limited thereto.

The RF transistor amplifier die 1000 is mounted on the upper surface of the metal submount 830 in an air-filled cavity 812 defined by the metal submount 830, the ceramic sidewalls 840 and the ceramic lid 842. Gate and drain terminals 132, 134 of RF transistor amplifier die 1000 are on the top side of the semiconductor structure 190, while the source terminal 136 is on the bottom side of the semiconductor structure 190. The source terminal 136 may be mounted on the metal submount 830 using, for example, a conductive die attach material (not shown). The metal submount 830 may provide the electrical connection to the source terminal 136 and may also serve as a heat dissipation structure that dissipates heat that is generated in the RF transistor amplifier die 1000.

Input matching circuits 850 and/or output matching circuits 852 may also be mounted within the package 800A. The matching circuits 850, 852 may include impedance matching and/or harmonic termination circuits. The impedance matching circuits may be used to match the impedance of the fundamental component of RF signals that are input to or output from the RF transistor amplifier to the impedance at the input or output of the RF transistor amplifier die 1000, respectively. The harmonic termination circuits may be used to ground harmonics of the fundamental RF signal that may be present at the input or output of the RF transistor amplifier die 1000. More than one input matching circuit 850 and/or output matching circuit 852 may be provided. As schematically shown in FIG. 8A, the input and output matching circuits 850, 852 may be mounted on the metal submount 830. The gate lead 822A may be connected to the input matching circuit 850 by one or more bond wires 854, and the input matching circuit 850 may be connected to the gate terminal 132 of RF transistor amplifier die 1000 by one or more additional bond wires 854. Similarly, the drain lead 824A may be connected to the output matching circuit 852 by one or more bond wires 854, and the output matching circuit 852 may be connected to the drain terminal 134 of RF transistor amplifier die 1000 by one or more additional bond wires 854. The bond wires 854, which are inductive elements, may form part of the input and/or output matching circuits.

A multi-layer environmental barrier 160 as described herein is formed on the top side of the semiconductor structure 190, and may be patterned to expose the gate and drain terminals 132, 134. The multi-layer environmental barrier 160 may include two or more sublayers of respective insulating materials, for example, in a repeating layer structure, as described above. The compositions and/or thicknesses of the sublayers, the number of sublayers, and/or the number of periods, may vary based on the ionic content or other contaminants that may be present in the particular package types 800A, 800B, 800C.

FIG. 8B is a schematic side view of a packaged Group III nitride-based RF transistor amplifier 800B that includes the transistor device 1000 packaged in a printed circuit board based package structure 810B. The packaged RF transistor amplifier 800B is very similar to the packaged RF transistor amplifier 800A of FIG. 8A, except that the gate and drain leads 822A, 824A of package structure 810A are replaced with printed circuit board based leads 822B, 824B in package structure 810B.

The package structure 810B includes a submount 830, ceramic sidewalls 840, a ceramic lid 842, each of which may be substantially identical to the like numbered elements of package structure 810A discussed above. The package structure 810B further includes a printed circuit board 820. Conductive traces on the printed circuit board 820 form a metal gate lead 822B and a metal drain lead 824B. The printed circuit board 820 may be attached to the submount 830 via, for example, a conductive glue. The printed circuit board 820 includes a central opening and the RF transistor amplifier die 1000 is mounted within this opening on the submount 830. Other components of RF transistor amplifier 800B may be the same as the like-numbered components of RF transistor amplifier 800A, and hence further description thereof will be omitted.

FIG. 8C is a schematic side view of another packaged Group III nitride-based RF transistor amplifier 800C. RF transistor amplifier 800C differs from RF transistor amplifier 800A in that it includes a different package structure 810C. The package structure 810C includes a metal submount 830 (which may be similar or identical to the submount 830 of package structure 810A), as well as metal gate and drain leads 822C, 824C. RF transistor amplifier 800C also includes a plastic overmold 860 that at least partially surrounds the RF transistor amplifier die 1000, the leads 822C, 824C, and the metal submount 830. Other components of RF transistor amplifier 800C may be the same as the like-numbered components of RF transistor amplifier 800A and hence further description thereof will be omitted.

Figure 9:
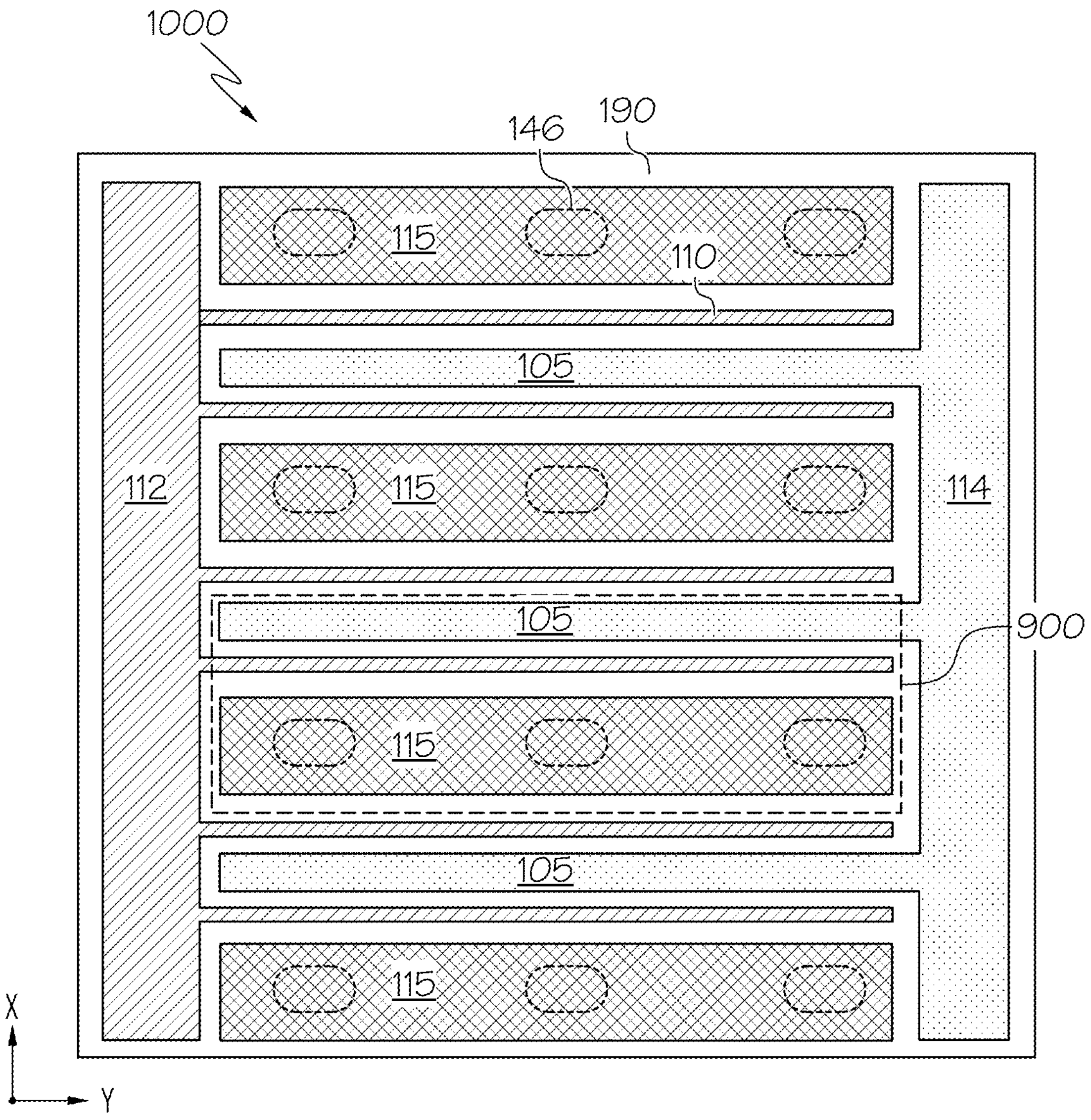
FIG. 9 is a schematic plan view of a Group III nitride-based transistor die according to embodiments of the present invention that illustrates metallization on a surface of the semiconductor layer structure thereof.

FIG. 9 is a schematic plan view of the transistor device or die 1000 that illustrates metallization on a surface of the semiconductor structure 190. The multi-layer environmental barrier 160 and/or other dielectric layers, which are provided as described herein to isolate the various conductive elements of the metallization structure from each other, are not shown in FIG. 9 to simplify the drawing.

As shown in FIG. 9, the transistor device or die 1000 may include multiple transistor structures 900 connected in parallel to device terminals or electrodes (e.g., an input terminal, an output terminal, and a ground terminal). For example, each of the gate 110, drain 105, and source 115 contacts may extend in a first direction (e.g., the Y-direction) to define gate, drain, and/or source 'fingers', which may be connected by one or more respective buses (e.g., by a gate bus 112 and a drain bus 114 on an upper surface of the semiconductor structure 190.

In FIG. 9, the gate fingers 110, drain fingers 105 and source fingers 115 extend in parallel to each other, with the gate fingers 110 extending from the gate bus 112 in a first direction and the drain fingers 105 extending from the drain bus 114 in a direction opposite the first direction. Each gate finger 110 may be positioned between a drain finger 105 and a source finger 115 to define a unit cell 900, such as the unit cell transistor structures 200, 300, 400 described herein. The gate fingers 110, drain fingers 105, and source fingers 115 (and connecting buses) may define part of gate-, drain-, and source-connected electrodes of the device, respectively, as defined by a top or frontside metallization structure. Since the gate fingers 110 are electrically connected to a common gate bus 112, the drain fingers 105 are electrically connected to a common drain bus 114, and the source fingers 115 are electrically connected together (e.g., through respective via openings 146 and a backside metal layer on the back surface of the substrate 122), it can be seen that the unit cell transistors 900 are electrically connected together in parallel.

One of the terminals of the device (e.g., a source terminal connected to the source contact(s) 115) may be configured to be coupled to a reference signal such as, for example, an electrical ground. In some embodiments, a conductive through substrate via connection or structure (e.g., a backside via opening formed through the back surface) may extend through the substrate 122 and epitaxial layer(s) 124, 126 to expose a portion of one of the contacts 105, 115, so as to allow for contact pads or terminals on the back side of the substrate (e.g., to couple the source contact 115 to ground). In other embodiments, a ground connection to one of the terminals device (e.g., the source terminal) may be provided outside the active area, e.g., in a peripheral area. In some embodiments, a backmetal layer on the back side of the substrate 122 may provide a backside ground plane, for example, in applications where proximity to ground may be desired.

Further embodiments of the present invention may arise from realization that humidity protection can be improved by increasing the thickness of an environmental barrier film. However, in some single layer environmental barrier films, the increased thickness may also increase uniaxial static film stress during operation, which may reduce or degrade device lifetime. For example, as discussed herein, SiN deposited by CVD may be used as an environmental barrier film. CVD-based SiN films may include a type of stress (e.g. tensile or compressive) that may be adjusted by modulating the deposition conditions (e.g., temperature), but the magnitude of stress may increase with thickness of the SiN layer. The increased stress may negatively affect device properties, for example, in the transistor channel region. In particular, in HEMT devices, stress may affect carrier density in the 2DEG channel, which may result in device performance degradation.

The term "stress" as used herein may refer to force exerted between neighboring particles of a material (e.g., as induced by intrinsic forces from overlying or underlying layers), while "strain" may refer to a measure of deformation of the material (e.g., due to the stress from the layers). Embodiments of the present invention may provide stress-compensated multi-layer encapsulation structures or environmental barriers that are configured to reduce or minimize stress, in some embodiments while also providing equivalent or better humidity protection than some conventional environmental barrier films. For example, uniaxial stress can be reduced or minimized by providing multiaxial stress (e.g., uniaxial, biaxial, or triaxial) in multi-layered thin films as described herein. The overall stress may be compensated by fabricating the sublayers of the multi-layer environmental barrier to provide a different type and/or directional stress in each sublayer, such that respective sublayers may compensate for the stress provided by sublayers thereabove and/or therebelow in the stack.

As used herein, a layer or sublayer that "compensates for" the stress of another layer or sublayer may include a stress that opposes (with respect to type and/or direction) or otherwise at least partially compensates for or counteracts the specific type and/or direction(s) of stress of the other layer or sublayer. That is, multi-layer environmental barrier films as described herein may include sublayers having respective stresses that vary in type (e.g., tensile or compressive) and/or direction (e.g., in the X-, Y-, and/or Z-directions). For example, advanced deposition techniques, such as atomic layer deposition (ALD), may be used to form multi-layer films with sublayers of various materials, such that each sublayer has a respective stress that is different from that of the sublayer above or below. ALD may be used to form the sublayers of different materials in various combinations, including binary, ternary, and quaternary stacks. The multi-layer environmental barriers as described herein may be configured to provide stress reduction alone or in combination with the diffusion barrier properties (e.g., humidity protection) described herein.

Figure 10:
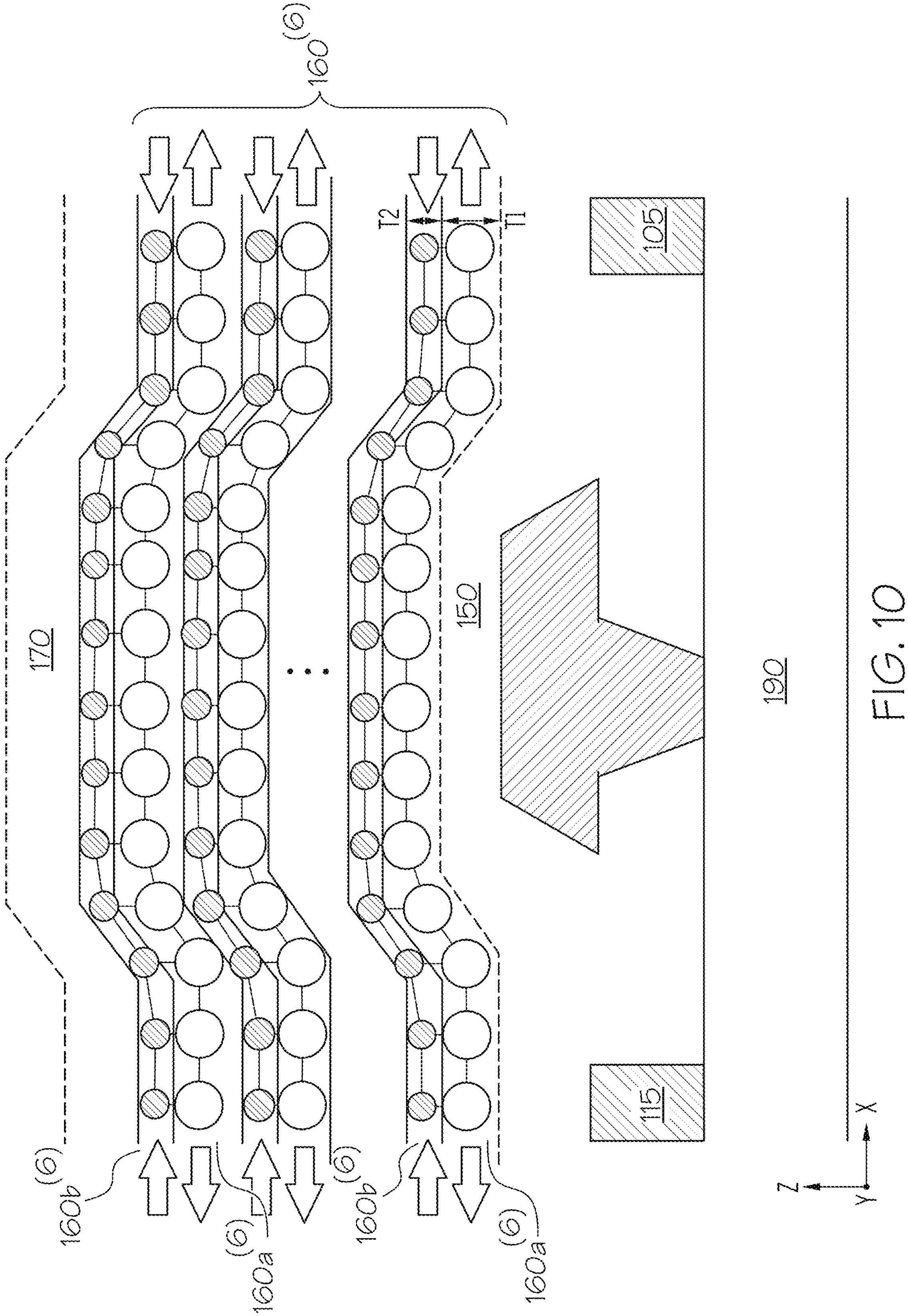
FIG. 10 is an enlarged view of a transistor device illustrating respective stresses of sublayers of multi-layer environmental barriers according to some embodiments of the present invention.

FIG. 10 is an enlarged view of a transistor device illustrating an example combination of stress-compensating sublayers in a multi-layer environmental barrier formed on a semiconductor body according to some embodiments of the present invention in greater detail. While shown in FIG. 10 with reference to a binary periodic structure $160^{(6)}$ including first and second stressor sublayers $160a^{(6)}$, $160b^{(6)}$ alternatingly stacked on an optional passivation layer or layer structure 150, it will be understood that this structure 160$^{(6)}$ is illustrated by way of example only, and as with the multi-layer environmental barriers 160', 160", 160'", 160$^{(4)}$, 160$^{(5)}$ described above, the multi-layer environmental barrier 160$^{(6)}$ (collectively 160) may include more than two stressor sublayers having different respective stresses (e.g., defining a ternary structure, a quaternary structure), and/or may be stacked in non-repeating layer structures or repeating layer structures that are periodic or non-periodic, either directly on the semiconductor body 190 and gate 110, drain 105, and source 115 contacts, or on the optional intervening passivation layer 150.

In the example of FIG. 10, the multi-layer environmental barrier 160$^{(6)}$ includes a stack of stressor sublayers 160*a*$^{(6)}$, 160*b*$^{(6)}$ of respective materials that are alternatingly stacked to define periodic repeating layer structure, with each period including a first sublayer 160*a*$^{(6)}$ and a second sublayer 160*b*$^{(6)}$ having respective stresses that differ in type and/or direction. One of the respective materials of the first and second stressor sublayers 160*a*$^{(6)}$, 160*b*$^{(6)}$ may be configured to provide a stress that at least partially counteracts or compensates for the type and/or direction(s) of stress in the other. For example, the first stressor sublayer 160*a*$^{(6)}$ may be an AlO film and the second stressor sublayer 160*b*$^{(6)}$ may be an SiO film (e.g., with tensile and compressive stress, respectively), and may be alternately formed as a binary stack in a repeating layer structure using relatively simple and stable ALD processes.

As shown in FIG. 10, the first stressor sublayer 160*a*" may include tensile stress (shown by the opposing arrows pointing away from one another along the X-direction), while the second stressor sublayer 160*b*$^{(6)}$ may include compressive stress (shown by the facing arrows pointing towards one another along the X-direction) that can at least partially compensate for the tensile stress of the first stressor sublayer 160*a*$^{(6)}$, or vice versa, such that an overall or collective stress of the multi-layer environmental barrier 160$^{(6)}$ is reduced or minimized. The materials, thicknesses, and/or fabrication processes of the respective stressor sublayers 160*a*$^{(6)}$, 160*b*$^{(6)}$ may be selected such that the stress in each sublayer 160*a*$^{(6)}$, 160*b*$^{(6)}$, etc. is at least partially counteracted by the sublayer directly above and/or the sublayer below. As such, it will be understood that the stress directions of respective sublayers are illustrated by way of example only, and can be changed to provide a desired type and/or direction of stress by varying the deposition conditions and post treatments (e.g., annealing). More generally, while sublayers may be described and illustrated herein with reference to particular stress types (e.g., tensile or compressive) and/or directions of stress (e.g., the X-, Y-, and/or Z-directions), the sublayers may have the opposite stress types and/or different directions than those illustrated, depending on the selected fabrication processes and/or conditions.

In the example of FIG. 10, the material of the first stressor sublayer 160*a*$^{(6)}$ may be selected and deposited such that the sublayer 160*a*$^{(6)}$ has tensile stress, for example, as induced by intrinsic forces from an underlying layer. For example, in some embodiments one or more optional passivation layers 150 (e.g., CVD-based SiN) may be formed on the surface of the semiconductor body 190 prior to the multi-layer environmental barrier 160$^{(6)}$ to passivate surface states, and/or otherwise improve electrical properties along the surface of the semiconductor body 190. The passivation layer(s) 150 may also protect against metal corrosion of the gate 110, source 115, and drain 105 contacts. However, the passivation layer(s) 150 may introduce additional stress (e.g., compressive stress from an SiN-based passivation layer 150).

Still referring to FIG. 10, the material of the second stressor sublayer 160*b*$^{(6)}$ may be selected and deposited such that the sublayer 160*b*$^{(6)}$ has compressive stress, for example, to compensate for or otherwise oppose the tensile stress of the underlying first sublayer 160*a*$^{(6)}$. In some embodiments, the passivation layer(s) 150 may be omitted, and the stressor sublayers 160*a*$^{(6)}$, 160*b*$^{(6)}$ of the multi-layer environmental barrier 160$^{(6)}$ may be formed directly on the surface of the semiconductor body 190 and the gate 110, source contact 115, and drain contact 105, e.g., conformally with respective thicknesses T1 and T2 that are substantially uniform. It will be understood that the stressor sublayers 160*a*$^{(6)}$, 160*b*$^{(6)}$ of the multi-layer environmental barrier 160 may be implemented in the stack in any order, such that the stress of each sublayer at least partially opposes or compensates for the stress of the layer thereabove or therebelow in the stack.

The stressor sublayers 160*a*$^{(6)}$, 160*b*$^{(6)}$ defining the repeating layer structure of the multi-layer environmental barrier 160$^{(6)}$ may have the same or different thicknesses from one another. In some embodiments, at least two of the sublayers of each period of the multi-layer environmental barrier 160$^{(6)}$ may have different thicknesses from one another. In particular, FIG. 10 illustrates binary periodic layer structures, where the first, tensile stress material sublayer 160*a*$^{(6)}$ may be deposited with a thickness T1 that is greater than the thickness T2 of the second, compressive stress material sublayer 160*b*$^{(6)}$. Similarly, a multi-layer environmental barrier 160$^{(6)}$ including a ternary periodic layer structure or quaternary periodic layer structure may include three sublayers or four sublayers, respectively, where at least two of the sublayers in each period may differ in thickness and/or stress.

A ratio of a thickness T1 of the first sublayer 160*a*$^{(6)}$ to a thickness T2 of the second sublayer 160*b*$^{(6)}$ may be varied depending or based on the amount of stress in each sublayer and the compensating stress of the sublayer thereabove or therebelow. For example, the ratio of the thickness T1 of the first sublayer 160*a*$^{(6)}$ to the thickness T2 of the second sublayer 160*b*$^{(6)}$ may be about 1:1, about 1:2, about 1:5, about 1:8, or about 1:10 or more. That is, the thickness ratios of the stressor sublayers 160*a*$^{(6)}$, 160*b*$^{(6)}$ may be dependent or based on the respective stresses of the different materials of the stressor sublayers 160*a*$^{(6)}$, 160*b*$^{(6)}$ and the effects provided on the layers thereabove or therebelow. It will be understood that relative sizes or dimensions are illustrated by way of example only, and are not intended to be limiting as to atomic sizes, densities, or other characteristics of the layers. Also, while primarily illustrated with reference to uniaxial or biaxial strain (e.g., in the X- and/or Y-directions) for simplicity, it will be understood that the sublayers described herein may be strained in additional and/or different directions (e.g., triaxial strain in the X-, Y-, and Z-directions) than those specifically shown.

In some embodiments, the multi-layer environmental barrier 160$^{(6)}$ may be configured to provide stress reduction in combination with diffusion barrier properties (e.g., humidity protection). As such, the ratio of the thickness T1 of the first sublayer 160*a*$^{(6)}$ to the thickness T2 of the second sublayer 160*b*$^{(6)}$ may be about 2:1, about 5:1, about 8:1, or about 10:1 or more, as described above with reference to the embodiments of FIGS. 5A to 5E.

For example, as described above with reference to FIG. 5A, the first stressor sublayer 160*a*$^{(6)}$ may include a comparatively higher-density material (e.g., AlO, HfO, ZrO, or other metal-rich insulating material), and the second stressor sublayer 160$b^{(6)}$ may include a comparatively lower-density material (e.g., SiO, SiN, or other metal-poor insulating material). One or more of the stressor sublayers 160$a^{(6)}$, 160$b^{(6)}$ may have a density that is greater than that of SiN, while another of the stressor sublayers 160$a^{(6)}$, 160$b^{(6)}$ may have a density that is less than or equal to that of SiN. When configured to provide stress reduction in combination with humidity protection, the first, higher-density material sublayer 160$a^{(6)}$ may be deposited initially with a greater thickness T1, followed by the second, lower-density material sublayer 160$b^{(6)}$ with the lesser thickness T2, such that the first stressor sublayer 160$a^{(6)}$ is between the second stressor sublayer 160$b^{(6)}$ and the semiconductor body 190.

In some embodiments, as described above with reference to FIG. 5B, the first and second stressor sublayers 160$a^{(6)}$, 160$b^{(6)}$ may be respective oxide materials that are alternatingly stacked to define periodic repeating layer structure. For example, as described above with reference to FIG. 5C, the first and second stressor sublayers 160$a^{(6)}$, 160$b^{(6)}$ may include an insulating metal oxide material or layer (e.g., AlO, HfO, or ZrO) and an insulating non-metal (e.g., semi-metal) oxide material or layer (e.g., SiO) alternatingly stacked in a periodic repeating layer structure, where the metal oxide sublayers may improve susceptibility to oxidation, etching, and/or corrosion of the non-metal oxide sublayers. In some embodiments, as described above with reference to FIG. 5D, the first and second stressor sublayers 160$a^{(6)}$, 160$b^{(6)}$ may include respective nitride materials that are alternatingly stacked to define periodic repeating layer structure, where the respective nitride materials of the sublayers may differ from one another in material composition.

The stressor sublayers 160$a^{(6)}$, 160$b^{(6)}$ of the multi-layer environmental barrier 160$^{(6)}$ may not be limited to insulating layers. For example, as described above with reference to FIG. 5E, one or more metal layers may be formed in the stack to provide a desired tensile or compressive stress in one or more desired directions, e.g., based on selection of materials and/or deposition processes as described herein. As such, the multi-layer environmental barrier 160$^{(6)}$ may include a first sublayer 160$a^{(6)}$ of an insulating metal oxide material (e.g., AlO, HfO, or ZrO) and a second sublayer 160$b^{(6)}$ of a metal material (e.g., Al, Au) alternatingly stacked in a periodic repeating layer structure, where the metal sublayers 160$b^{(6)}$ may provide more effective barriers to humidity ingress.

It will be understood that multi-layer environmental barriers 160$^{(6)}$ according to embodiments of the present invention are not limited to the specific sublayer material combinations described with reference to the above examples. For example, in some embodiments, the stressor sublayers 160$a^{(6)}$, 160$b^{(6)}$ may include organic materials and inorganic materials alternatingly stacked to define the multi-layer environmental barrier 160$^{(6)}$. More generally, the multi-layer environmental barrier 160$^{(6)}$ may include any combination of sublayers that are configured to at least partially counteract the stress of the sublayer thereabove and/or therebelow.

In some embodiments, two or more sublayers of the multi-layer environmental barrier 160$^{(6)}$ may be formed by a conformal deposition process, such ALD (including, but not limited to thermal ALD and plasma-enhanced ALD (PEALD) processes). For example, the stressor sublayers 160$a^{(6)}$, 160$b^{(6)}$ shown in FIG. 10 may be formed in accordance with the operations shown in FIGS. 7A to 7D, where ALD processes are performed to conformally deposit a first stressor sublayer 160$a^{(6)}$ (more generally shown as 160$a$) on a transistor structure including a gate 110, source contact 115, and drain contact 105 on a semiconductor body 190 (illustrated in with reference to a HEMT device), and to conformally deposit a second stressor sublayer 160$b^{(6)}$ (more generally shown as 160$b$) on the surface of the first insulating sublayer 160$a$. More specifically, by alternating exposures to reactant A (as shown in FIG. 7B) and reactant B (as shown in FIG. 7C), a thin film multi-layer environmental barrier 160 including alternating stressor sublayers 160$a$ and 160$b$ in a repeating (e.g., binary) layer structure is deposited, with a substantially uniform thickness and with high conformality on the complex underlying shapes or structures as shown in FIG. 7D. Additional reactants may be included in the alternating exposures to deposit ternary or quaternary repeating layer structures. In some embodiments, at lower temperatures, the ALD processes as shown in FIGS. 7B and 7C may produce amorphous stressor sublayer films, which may be subsequently crystallized. For example, the first stressor sublayer 160$a$ may be deposited as amorphous AlOx, which may be crystalized to form $Al_2O_3$. The second s stressor sublayer 160$b$ may be deposited as amorphous SiOx, which may be crystalized to form $SiO_2$.

While described primarily in the above examples with reference to ALD-based fabrication, it will be understood that the stressor sublayers 160$a^{(6)}$, 160$b^{(6)}$ of the multi-layer environmental barrier 160$^{(6)}$ may be formed by deposition methods other than ALD. For example, CVD may be used to form multi-layer films 160$^{(6)}$ as described herein in some embodiments. However, thinner CVD-based sublayers 160$a^{(6)}$, 160$b^{(6)}$ may be too porous to provide desired moisture barrier performance, while thicker CVD-based sublayers 160$a^{(6)}$, 160$b^{(6)}$ may increase stress per sublayer. Also, while the quality of CVD-based barrier films 160 may be improved with fabrication at higher temperatures, such temperatures may be damaging to characteristics and/or operation of devices in the underlying semiconductor layer structure 190.

Figure 11:
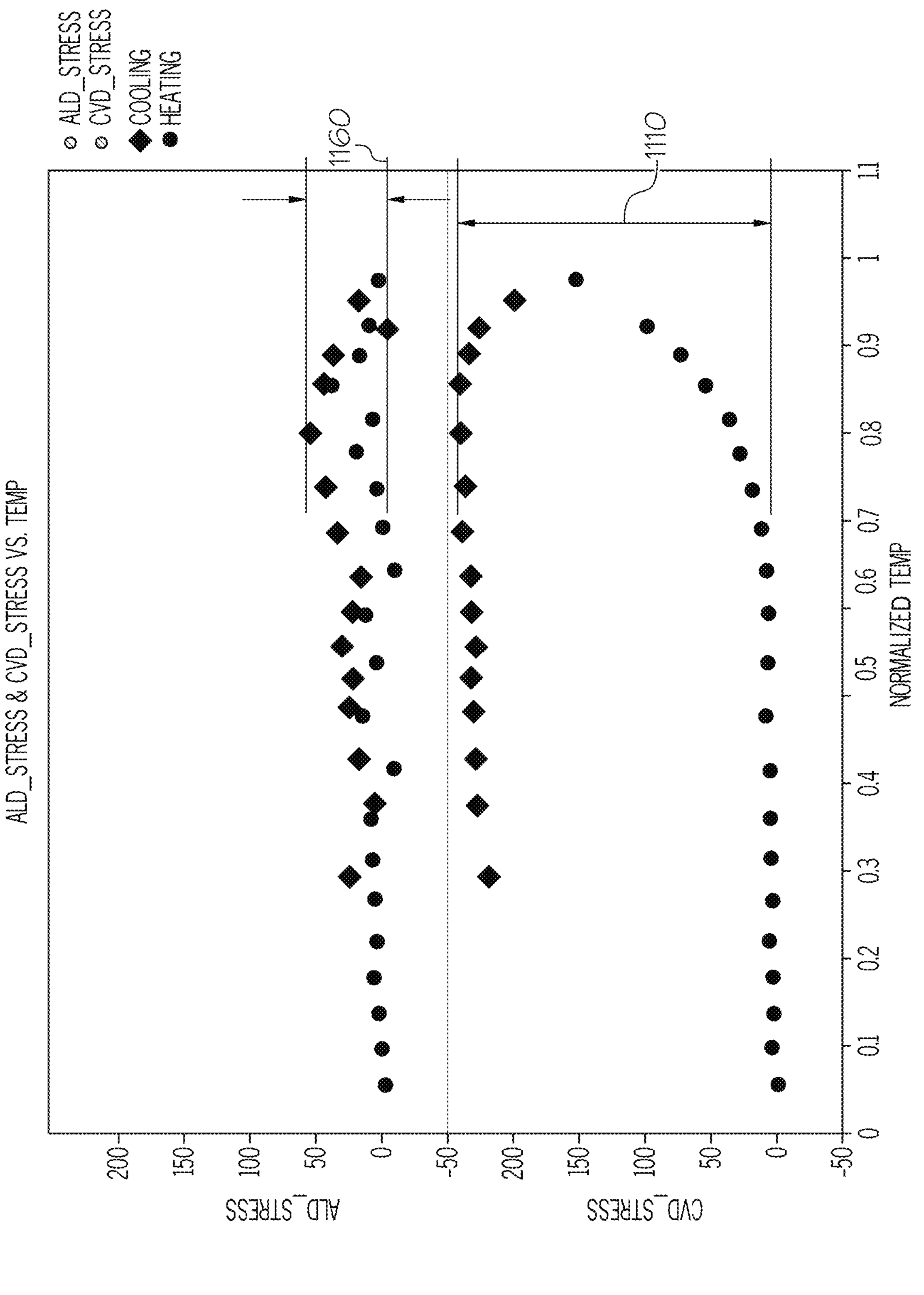
FIG. 11 is a graph illustrating stress versus temperature in multi-layer environmental barriers according to some embodiments of the present invention relative to a comparative example.

FIG. 11 is a graph illustrating normalized stress measurement over temperature changes of heating and cooling for a conventional single-layer film formed by CVD (also referred to herein as a CVD-based single layer film) and a multi-layer environmental barrier formed by ALD in accordance with some embodiments of the present invention, with the initial stress to normalized to zero. For example, a Highly Accelerated Stress Test (HAST) process may involve heating and cooling of devices over operating temperature ranges of up to about 400 degrees Celsius (C) or more.

As shown in FIG. 11, the conventional CVD-based single layer film (e.g., a SiN-based film) may exhibit a variation in stress 1110 of about 235 megapascals (MPa) during heating and cooling over a normalized operating temperature range from room temperature (25 degrees C) to maximum device operating temperature. In contrast, FIG. 11 illustrates that an ALD-based multi-layered AlOx and SiOx environmental barrier film according to some embodiments of the present invention may exhibit a variation in stress 1160 of only about 40 MPa during heating and cooling over the same room temperature to maximum device operating temperature range. As such, environmental barrier films according to some embodiments of the present invention may include reduced stress (and a smaller variation in stress) over temperature ranges that may be experienced in device operation, due to overall compensated stress provided by the multiple stressor sublayers thereof as compared to a CVD based single-layered SiN film. That is, multi-layer environmental barrier films according to embodiments of the present invention may be subjected to lower levels of stress and/or less stress variation (and thus greater stability) over device operating conditions than some conventional single-layer films, which may reduce the operating lifetime of the device.

The multi-layer environmental barrier and the single-layer film illustrated in the graph of FIG. 11 may have respective thicknesses and/or other characteristics that provide one or more similar diffusion barrier properties (e.g., similar or equivalent humidity protection). For example, conventional techniques may provide environmental barrier films using CVD based SiNx, which may require a greater thickness (e.g., about 5000 Angstroms to about 10,000 Angstroms) to provide desired level of humidity protection, and may thus result in higher uniaxial stress (e.g., a difference of about 235 MPa before/after heating and cooling in this example). In contrast, a multi-layer environmental barrier film (e.g., including alternating layers of ALD-based AlOx and SiOx) as described herein can provide a significant reduction in stress (lesser or even negligible due to measurement tolerance) at equivalent or superior humidity robustness, in some instances with lesser overall thickness (e.g., about 500 Angstroms to about 3500 Angstroms, for example, about 1000 Angstroms to about 3000 Angstroms or about 1500 Angstroms to about 2500 Angstroms). In other words, a collective stress of the sublayers 160*a*, 160*b* of the multi-layer environmental barrier 160 may be less than that of one or more SiN layers that provides a similar diffusion barrier property, in some embodiments over a temperature range of about room temperature (25 degrees C) to maximum device operating temperature. The sublayers can be deposited using non-ALD methods in some embodiments.

Multi-layer environmental barrier stacks (e.g., binary stacks, ternary stacks, quaternary stacks, etc.) in accordance with embodiments of the present invention can thus provide equivalent or superior diffusion barrier properties, but with lower collective stress and/or smaller thickness, as compared to a SiN film. As noted above, the multi-layer environmental barrier is not limited to alternating AlOx and SiOx sublayers, and may alternatively include HfO, ZrO and/or SiN sublayers, and/or other sublayers, depending on the desired compensatory stress and/or direction(s).

Embodiments of the present invention including multi-layer environmental barrier structures as described herein may provide improved performance in passive and/or active RF devices. However, embodiments of the present invention are not limited to RF applications, and may be used in various other applications, including any semiconductor IC technology that may require humidity robustness. For example, embodiments of the present invention may be used in applications with operating frequencies that range from less than about 6 GHz to Ku-band (6-18 GHz) and Ka-Band designs (e.g., 26-40 GHz). Particular embodiments of the present invention may be used various cellular infrastructure (CIFR) RF power products (including, but not limited to 5 W, 10 W, 20 W, 40 W, 60 W, 80 W and different frequency bands), e.g., for 5G and base station applications, including macro (e.g., 20-80 W and different frequency bands) average power applications. Embodiments of the present invention may also be applied to radar, monolithic microwave integrated circuit (MMIC)-type applications, dielectric crossover devices, and split gate devices. More generally, embodiments of the present invention may be used in any semiconductor IC technology that require humidity robustness and/or stress reduction.

The present invention is described with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will also be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein. All publications, patent applications, patents, and other references mentioned herein are incorporated by reference in their entirety.

In the drawings and specification, there have been disclosed typical embodiments of the invention, and, although specific terms have been employed, they have been used in a generic and descriptive sense only and not for purposes of limitation.

That which is claimed:

1. A semiconductor die, comprising:

a semiconductor body; and a multi-layer environmental barrier comprising a plurality of sublayers that are stacked on the semiconductor body, wherein each of the sublayers comprises a respective stress in one or more directions, and wherein the respective stresses of at least two of the sublayers oppose one another, and wherein the at least two of the sublayers comprise a first stressor sublayer of a first material and a second stressor sublayer of a second material, wherein the first material has a greater density than the second material, and the first stressor sublayer is thicker than the second stressor sublayer.

2. The semiconductor die of claim 1, wherein the first stressor sublayer is configured to provide a first stress, and the second stressor sublayer is configured to provide a second stress that at least partially compensates for the first stress in the one or more directions.

3. The semiconductor die of claim 2, wherein the first stress is tensile, and the second stress is compressive.

4. The semiconductor die of claim 2, wherein the first and second stressor sublayers comprise first and second oxide materials, respectively, wherein the first oxide material is different than the second oxide material.

5. The semiconductor die of claim 2, wherein at least one of the first or second stressor sublayers comprises a metal insulating material.

6. The semiconductor die of claim 5, wherein at least one of the sublayers comprises a conductive metal layer.

7. The semiconductor die of claim 5, wherein the metal insulating material comprises at least one of aluminum oxide, zirconium oxide, or hafnium oxide.

8. The semiconductor die of claim 5, wherein another of the first or second stressor sublayers comprises a non-metal insulating material.

9. The semiconductor die of claim 8, wherein the metal insulating material comprises aluminum oxide, and wherein the non-metal insulating material comprises silicon oxide.

10. The semiconductor die of claim 2, wherein the sublayers comprise a repeating layer structure that includes the first and second stressor sublayers.

11. The semiconductor die of claim 10, wherein the repeating layer structure comprises:

a binary structure in which the first and second stressor sublayers are stacked;

a ternary structure in which the first stressor sublayer, the second stressor sublayer, and a third stressor sublayer are stacked; and/or a quaternary structure in which the first stressor sublayer, the second stressor sublayer, the third stressor sublayer, and a fourth stressor sublayer are stacked.

12. The semiconductor die of claim 11, wherein the multi-layer environmental barrier comprises at least two of the repeating layer structure, at least ten of the repeating layer structure, or at least twenty of the repeating layer structure.

13. The semiconductor die of claim 2, wherein the first stressor sublayer is between the second stressor sublayer and the semiconductor body.

14. The semiconductor die of claim 2, wherein a density of at least one of a first material of the first stressor sublayer or a second material of the second stressor sublayer is greater than silicon nitride.

15. The semiconductor die of claim 2, wherein a ratio of a thickness of the first stressor sublayer to a thickness of the second stressor sublayer is about 2:1 or more, about 5:1 or more, or about 8:1 or more.

16. The semiconductor die of claim 2, further comprising:

a gate, a source contact, and a drain contact on the semiconductor body, wherein the first and second stressor sublayers conformally extend directly on the gate, the source contact, and the drain contact with respective thicknesses that are substantially uniform.

17. The semiconductor die of claim 2, wherein the first and second stressor sublayers comprise Atomic Layer Deposition (ALD) layers.

18. The semiconductor die of claim 1, wherein the multi-layer environmental barrier comprises one or more diffusion barrier properties, and wherein a collective stress of the sublayers of the multi-layer environmental barrier is less than that of one or more silicon nitride layers comprising at least one of the diffusion barrier properties.

19. The semiconductor die of claim 18, wherein a total thickness of the multi-layer environmental barrier is about 500 Angstroms to about 3500 Angstroms.

20. A semiconductor die comprising:

a semiconductor body;

a multi-layer environmental barrier comprising two or more sublayers that are stacked on the semiconductor body in a repeating layer structure; and one or more silicon nitride layers between the semiconductor body and the multi-layer environmental barrier, wherein the multi-layer environmental barrier comprises two or more diffusion barrier properties, wherein a collective stress of the multi-layer environmental barrier is less than that of the one or more silicon nitride layers comprising at least one of the diffusion barrier properties, and wherein a thickness of the multi-layer environmental barrier is less than a thickness of the one or more silicon nitride layers.

21. The semiconductor die of claim 20, wherein each of the sublayers is configured to provide a respective stress in one or more directions, and wherein the respective stresses of at least two of the sublayers oppose one another and at least partially compensate for the respective stress of one of the sublayers directly thereabove or directly therebelow.

22. The semiconductor die of claim 21, wherein the at least two of the sublayers comprise a first stressor sublayer configured to provide a first stress, and a second stressor sublayer configured to provide a second stress that at least partially compensates for the first stress in the one or more directions.

23. The semiconductor die of claim 22, wherein the first stress at least partially compensates for a third stress of the one or more silicon nitride layers directly thereon, and wherein the collective stress of the multi-layer environmental barrier is less than the third stress of the one or more silicon nitride layers over an operating temperature range of a packaged device including the semiconductor die.

24. The semiconductor die of claim 22, wherein at least one of the first or second stressor sublayers comprises metal insulating material.

25. The semiconductor die of claim 24, wherein another of the first or second stressor sublayers comprises a metal.

26. The semiconductor die of claim 24, wherein the metal insulating material comprises at least one of aluminum oxide, zirconium oxide, or hafnium oxide.

27. The semiconductor die of claim 24, wherein another of the first or second stressor sublayers comprises a non-metal insulating material.

28. A method of fabricating a semiconductor die, the method comprising:

providing a semiconductor body; and forming a multi-layer environmental barrier comprising a plurality of sublayers that are stacked on the semiconductor body, wherein forming the multi-layer environmental barrier comprises:

forming a first stressor sublayer comprising a first stress; and forming a second stressor sublayer comprising a second stress on the first stressor sublayer, wherein the second stress and the first stress oppose one another, wherein the first stressor sublayer comprises a first material having a greater density than a second material of the second stressor sublayer, and the first stressor sublayer is thicker than the second stressor sublayer.

29. The method of claim 28, wherein the first stress is tensile, and the second stress is compressive.

30. The method of claim 28, wherein forming the multi-layer environmental barrier comprises forming the first and second stressor sublayers using Atomic Layer Deposition (ALD).

31. The method of claim 30, wherein forming the multi-layer environmental barrier comprises:

alternatingly performing a first ALD process to form the first stressor sublayer and a second ALD process to form the second stressor sublayer in a repeating layer structure.

32. The method of claim 28, wherein the first stressor sublayer comprises a first material having a greater density than a second material of the second stressor sublayer.

33. The method of claim 28, wherein the first and second stressor sublayers comprise first and second oxide materials, respectively, wherein the first oxide material is different than the second oxide material.

34. The method of claim 28, wherein at least one of the first or second stressor sublayers comprises a metal insulating material.

35. The method of claim 34, wherein another of the first or second stressor sublayers comprises a metal.

36. The method of claim 34, wherein the metal insulating material comprises at least one of aluminum oxide, zirconium oxide, or hafnium oxide.

37. The method of claim 34, wherein another of the first or second stressor sublayers comprises a non-metal insulating material.

38. The method of claim 37, wherein the metal insulating material comprises aluminum oxide, and wherein the non-metal insulating material comprises silicon oxide.

39. A semiconductor die, comprising:

a semiconductor body; and a multi-layer environmental barrier on the semiconductor body, the multi-layer environmental barrier comprising a first sublayer of a metal insulating material and a second sublayer of a non-metal insulating material that are stacked, wherein respective stresses of the first and second sublayers oppose one another, wherein the first sublayer of the metal insulating material is thicker than the second sublayer of the non-metal insulating material.

40. The semiconductor die of claim 39, wherein the metal insulating material comprises a metal oxide or metal nitride, and wherein the non-metal insulating material comprises a non-metal oxide or a non-metal nitride.

41. The semiconductor die of claim 39, wherein the metal insulating material comprises at least one of aluminum (Al), zirconium (Zr), or hafnium (Hf), and wherein the non-metal insulating material comprises at least one of bismuth (B), silicon (Si), germanium (Ge), arsenic (As), antimony (Sb), or tellurium (Te).

42. The semiconductor die of claim 39, wherein the first sublayer is between the second sublayer and the semiconductor body.

43. The semiconductor die of claim 39, wherein the first sublayer comprises a first stress between particles of the metal insulating material, and the second sublayer comprises a second stress between particles of the non-metal insulating material that at least partially compensates for the first stress in one or more directions.

* * * * *